United States Patent
Henry et al.

(10) Patent No.: US 11,056,611 B2
(45) Date of Patent: Jul. 6, 2021

(54) MESA FORMATION FOR WAFER-TO-WAFER BONDING

(71) Applicant: Facebook Technologies, LLC, Menlo Park, CA (US)

(72) Inventors: William Padraic Henry, Cork (IE); James Ronald Bonar, Redmond, WA (US); Gareth Valentine, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/436,794

(22) Filed: Jun. 10, 2019

(65) Prior Publication Data
US 2020/0083402 A1 Mar. 12, 2020

Related U.S. Application Data

(60) Provisional application No. 62/729,820, filed on Sep. 11, 2018.

(51) Int. Cl.
| | |
|---|---|
| *H01L 33/00* | (2010.01) |
| *H01L 33/20* | (2010.01) |
| *G02B 27/00* | (2006.01) |

(52) U.S. Cl.
CPC .......... *H01L 33/0095* (2013.01); *H01L 33/20* (2013.01); *G02B 27/0093* (2013.01);
(Continued)

(58) Field of Classification Search
CPC ....... H01L 2924/00; H01L 2924/00014; H01L 2924/12041
See application file for complete search history.

(56) References Cited

U.S. PATENT DOCUMENTS

| 5,557,120 A | * | 9/1996 | Martin | .................... | H01L 25/50 257/187 |
|---|---|---|---|---|---|
| 7,518,149 B2 | | 4/2009 | Maaskant et al. | | |

(Continued)

FOREIGN PATENT DOCUMENTS

| EP | 2151852 A1 | 2/2010 |
|---|---|---|
| TW | 202030756 | 8/2020 |

(Continued)

OTHER PUBLICATIONS

Zhang et al., "Wafer Scale Hybrid Monolithic Integration of Si-based IC and III-V Epilayers—a Mass Manufacturable Approach for Active Matrix micro-LED Displays," Distinguished Paper, Hong Kong Beida Jade Bird Display Limited, SID 2018 DIGEST, 4 pages.

(Continued)

*Primary Examiner* — Jaehwan Oh
(74) *Attorney, Agent, or Firm* — Weaver Austin Villeneuve & Sampson LLP

(57) ABSTRACT

Disclosed herein are techniques for wafer-to-wafer bonding for manufacturing light emitting diodes (LEDs). In some embodiments, a method of manufacturing LEDs includes etching a semiconductor material to form a plurality of adjacent mesa shapes. The semiconductor material includes one or more epitaxial layers. The method also includes forming a passivation layer within gaps between the adjacent mesa shapes and bonding a base wafer to a first surface of the semiconductor material.

23 Claims, 13 Drawing Sheets

(52) U.S. Cl.
CPC ............... *H01L 2933/0025* (2013.01); *H01L 2933/0033* (2013.01); *H01L 2933/0058* (2013.01); *H01L 2933/0066* (2013.01)

(56) References Cited

U.S. PATENT DOCUMENTS

| | | | |
|---|---|---|---|
| 9,450,148 | B2 | 9/2016 | Shepherd |
| 2006/0211159 | A1 | 9/2006 | Bruederl et al. |
| 2006/0223330 | A1 | 10/2006 | Fudeta et al. |
| 2007/0181891 | A1* | 8/2007 | Eisert ............... H01L 24/95 257/82 |
| 2011/0140076 | A1* | 6/2011 | Song ............... H01L 33/0093 257/13 |
| 2012/0001202 | A1 | 1/2012 | Horng |
| 2013/0049016 | A1 | 2/2013 | Schellhammer et al. |
| 2014/0270671 | A1* | 9/2014 | Mustafeez ............... G02B 6/1225 385/129 |
| 2014/0361321 | A1 | 12/2014 | Saito et al. |
| 2015/0061101 | A1 | 3/2015 | Le et al. |
| 2015/0236201 | A1* | 8/2015 | Shepherd ............... H01L 33/0075 257/88 |
| 2015/0362625 | A1* | 12/2015 | Hyde ............... G02B 1/005 359/280 |
| 2016/0035932 | A1* | 2/2016 | Cha ............... H01L 33/002 438/29 |
| 2016/0035990 | A1* | 2/2016 | Jankovic ............... H01L 51/447 136/263 |
| 2016/0276329 | A1 | 9/2016 | Bono et al. |
| 2017/0040518 | A1 | 2/2017 | Guenard |
| 2017/0047481 | A1* | 2/2017 | Bonar ............... H01S 5/18341 |
| 2017/0069611 | A1 | 3/2017 | Zhang et al. |
| 2017/0194302 | A1 | 7/2017 | Disney |
| 2017/0271557 | A1 | 9/2017 | Brennan et al. |
| 2017/0313580 | A1 | 11/2017 | Cao et al. |
| 2018/0164502 | A1* | 6/2018 | Qin ............... G02B 6/24 |
| 2018/0166429 | A1 | 6/2018 | Chong et al. |
| 2019/0044040 | A1 | 2/2019 | Andrews |
| 2020/0083272 | A1* | 3/2020 | Zhang ............... H01L 27/14643 |
| 2020/0083399 | A1 | 3/2020 | Henry et al. |
| 2020/0083400 | A1 | 3/2020 | Henry et al. |

FOREIGN PATENT DOCUMENTS

| | | |
|---|---|---|
| WO | 2012113205 A1 | 8/2012 |
| WO | 2017037475 A1 | 3/2017 |
| WO | 2018223391 | 12/2018 |
| WO | 2020055537 | 3/2020 |
| WO | 2020055889 | 3/2020 |

OTHER PUBLICATIONS

Zhang et al., "Wafer-scale monolithic hybrid integration of Si-based IC and III-V epi-layers—a mass manufacturable approach for active matrix micro-LED micro-displays," Hong Kong Beida Jade Bird Display Limited, Journal of the SID, 2018, 9 pages.
Ou et al., "Monochromatic Active Matrix Micro-LED Micro-displays with >5,000 dpi Pixel Density Fabricated using Monolithic Hybrid Integration Process," Hong Kong Beida Jade Bird Display Limited, SID 2018 DIGEST, 4 pages.
International Application No. PCT/US2019/046536, International Search Report and Written Opinion dated Nov. 6, 2019, 11 pages.
International Application No. PCT/US2019/050441, International Search Report and Written Opinion dated Nov. 27, 2019, 10 pages.
International Application No. PCT/US2020/056712, International Search Report and Written Opinion dated Feb. 2, 2021, 10 pages.
U.S. Restriction Requirement dated Dec. 8, 2020 in U.S. Appl. No. 16/560,621.
U.S. Non-Final Office Action dated Dec. 10, 2020 in U.S. Appl. No. 16/436,790.

* cited by examiner

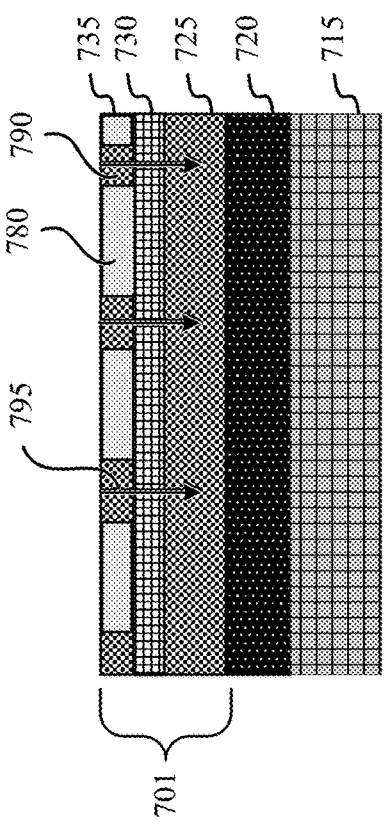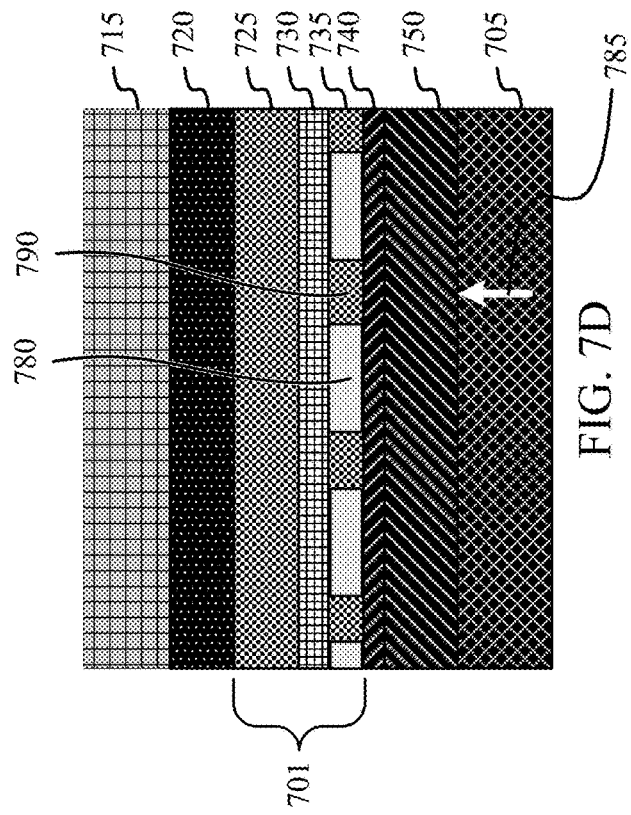
FIG. 7B
FIG. 7D
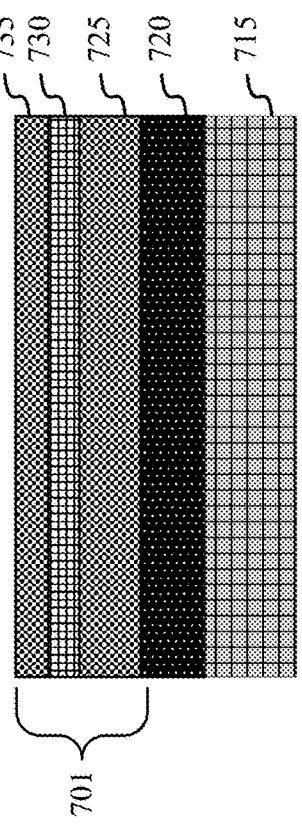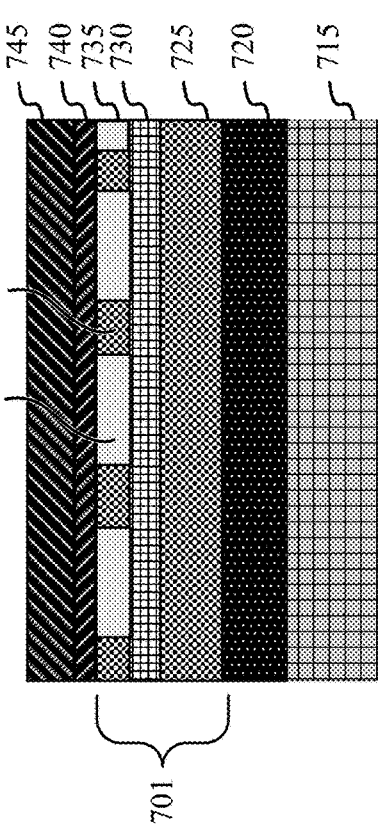
FIG. 7A
FIG. 7C

MESA FORMATION FOR WAFER-TO-WAFER BONDING

CROSS-REFERENCE TO RELATED APPLICATIONS

This application claims priority under 35 U.S.C. § 119 to U.S. Provisional Patent Application No. 62/729,820, filed on Sep. 11, 2018, the contents of which are hereby incorporated by reference in their entirety.

BACKGROUND

Light emitting diodes (LEDs) convert electrical energy into optical energy. In semiconductor LEDs, light is usually generated through recombination of electrons and holes within a semiconductor layer. A challenge in the field of LEDs is to extract as much of the emitted light as possible toward the desired direction. Various approaches may be used to increase the efficiency of an LED, such as adjusting the shape of the semiconductor layer, roughening the surface of the semiconductor layer, and using additional optics to redirect or focus the light.

SUMMARY

LEDs may be formed in a one-dimensional array or a two-dimensional array. Various manufacturing methods may be used, such as wafer-to-wafer bonding or pick-and-place techniques. In wafer-to-wafer bonding, an LED wafer having epitaxial layers may be flip-chip bonded to a base wafer having a driver circuit. After the two wafers have been bonded, the individual LEDs are singulated. Wafer-to-wafer bonding allows smaller LEDs to be manufactured than pick-and-place techniques, because it is unnecessary to pick, place, and bond individual LEDs. For example, LEDs having a chip diameter down to 1 μm can be manufactured with wafer-to-wafer bonding. However, related art wafer-to-wafer bonding methods may suffer from low light extraction efficiency.

The present disclosure generally relates to wafer-to-wafer bonding for manufacturing LEDs. In some embodiments, a method of manufacturing LEDs includes etching a semiconductor material to form a plurality of adjacent mesa shapes. The semiconductor material includes one or more epitaxial layers. The method also includes forming a passivation layer within gaps between the adjacent mesa shapes, and bonding a base wafer to a first surface of the semiconductor material.

The method may also include removing a substrate from a second surface of the semiconductor material, wherein the second surface of the semiconductor material is opposite to the first surface of the semiconductor material, and patterning a trench between each pair of the adjacent mesa shapes to form a plurality of LEDs. The method may also include forming a lens on a portion of the second surface of the semiconductor material corresponding to one of the plurality of LEDs. Alternatively or in addition, the method may include forming a structure of the second surface of the semiconductor material to enhance a spontaneous emission rate, wherein the structure corresponds to one of the plurality of LEDs.

Alternatively or in addition, the method may also include forming a first contact on the semiconductor material, wherein the first contact has a first polarity, and the first contact is formed before or after the plurality of adjacent mesa shapes are formed. The method may also include forming a second contact, wherein the second contact has a second polarity that is opposite to the first polarity of the first contact. The second contact may be a distributed contact and/or a large area contact.

Alternatively or in addition, the method may also include, before bonding the base wafer to the first surface of the semiconductor material, planarizing the first surface of the semiconductor material and the passivation layer, and depositing a bonding layer on the first surface of the semiconductor material, wherein the base wafer is bonded to the first surface of the semiconductor material via the bonding layer. The base layer may be bonded to the bonding layer by metal-to-metal bonding. Alternatively or in addition, the base layer may be bonded to the bonding layer by eutectic bonding. Alternatively or in addition, the base layer may be bonded to the bonding layer by oxide bonding. Alternatively or in addition, the base layer may be bonded to the bonding layer by anodic bonding, thermocompression bonding, ultraviolet bonding, and/or fusion bonding.

Alternatively or in addition, the method may also include, before forming the passivation layer within gaps between the adjacent mesa shapes, depositing a reflective layer on a side wall of each of the adjacent mesa shapes. Alternatively or in addition, the method may also include, before bonding the base wafer to the first surface of the semiconductor material, depositing a contact layer on the first surface of the semiconductor material and the passivation layer, and depositing a bonding layer on the contact layer. The base wafer may be bonded to the first surface of the semiconductor material via the contact layer and the bonding layer. The bonding layer and the contact layer made be made of different metals or the same metal.

The semiconductor material may include, in order, an n-type layer, a quantum well layer, and a p-type layer. Each of the adjacent mesa shapes may have non-vertical side walls. For example, each of the adjacent mesa shapes may have a parabolic shape. The base wafer may include a plurality of driver circuits, and the method may also include aligning the plurality of driver circuits with the adjacent mesa shapes while bonding the base wafer to the first surface of the semiconductor material.

The method may also include roughening a portion of the second surface of the semiconductor material corresponding to one of the plurality of LEDs. The substrate may be removed by focusing a laser beam at an interface between the substrate and the semiconductor material. The trenches may be patterned by lithography.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures:

FIGS. 7A-7G illustrate yet another method of wafer-to-wafer bonding for manufacturing LEDs;

DETAILED DESCRIPTION

Figure 1:
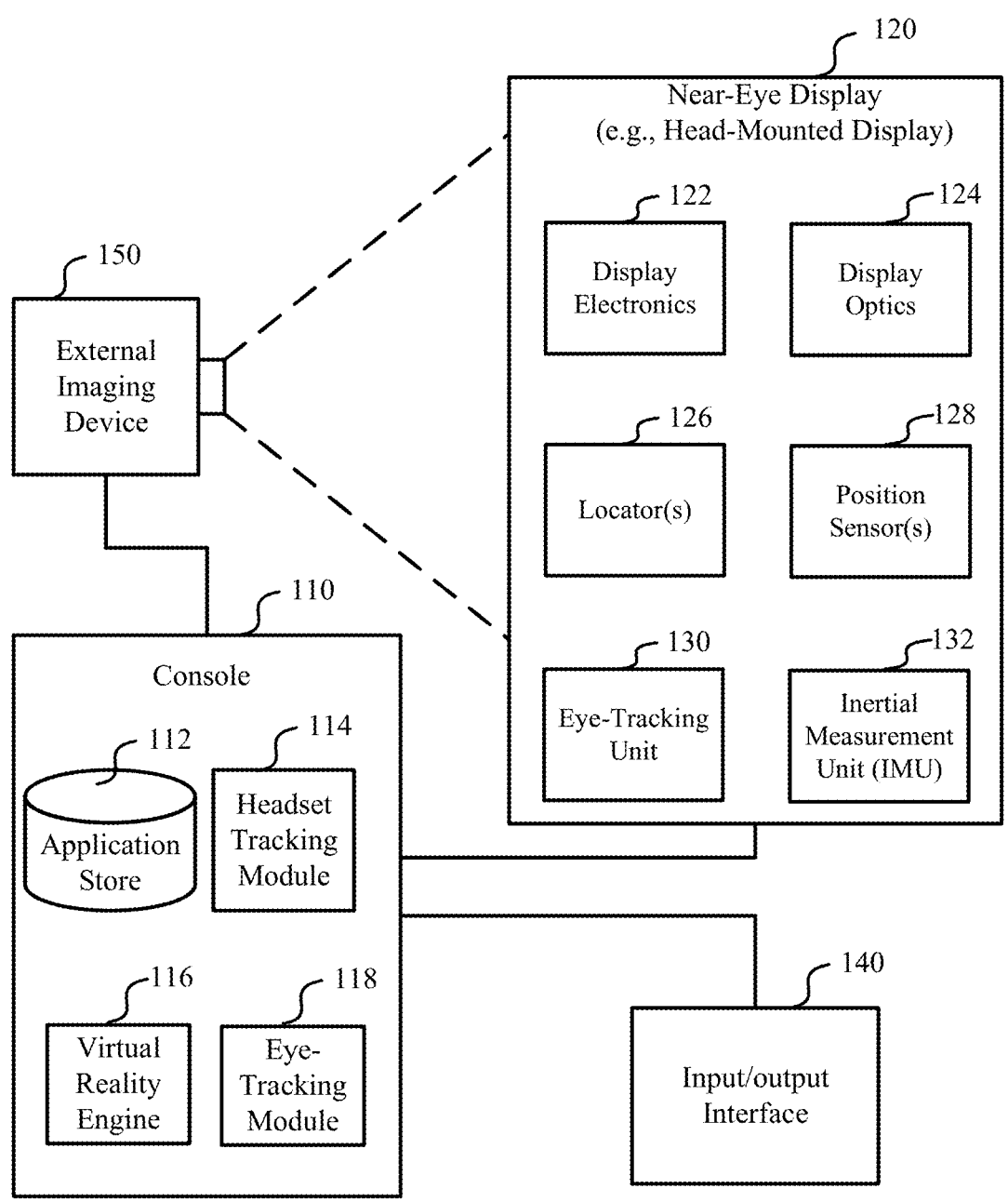
FIG. 1 is a simplified block diagram of an example artificial reality system environment including a near-eye display, according to certain embodiments.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

As used herein, visible light may refer to light with a wavelength between about 400 nm and about 750 nm. Near infrared (NIR) light may refer to light with a wavelength between about 750 nm and about 2500 nm. The desired infrared (IR) wavelength range may refer to the wavelength range of IR light that can be detected by a suitable IR sensor (e.g., a complementary metal-oxide semiconductor (CMOS) or a charge-coupled device (CCD) sensor), such as between 830 nm and 860 nm or between 930 nm and 980 nm.

As also used herein, a substrate may refer to a medium within which an array of chirped gratings may be inscribed. A chirped grating may refer to a grating whose pitch and angle of orientation changes over the extent of the grating. The substrate may include one or more types of dielectric materials, such as glass, quartz, plastic, polymer, poly(m-ethyl methacrylate) (PMMA), crystal, or ceramic. At least one type of material of the substrate may be transparent to visible light and NIR light. A thickness of the substrate may range from, for example, less than about 1 mm to less than about 10 mm. As used herein, a material may be "transparent" to a light beam if the light beam can pass through the material with a high transmission rate, such as larger than 60%, 75%, 80%, 90%, 95%, 98%, 99%, or higher, where a small portion of the light beam (e.g., less than 40%, 25%, 20%, 10%, 5%, 2%, 1%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Alternatively, a substrate may refer to a medium that is suitable for growing a semiconductor material. For example, the substrate may be made of sapphire, and the semiconductor material may be made of GaN. Other non-limiting examples of materials that may be used for the substrate include GaN, silicon, SiC, GaAs, and GaP.

An artificial reality system, such as a virtual reality (VR), augmented reality (AR), or mixed reality (MR) system, may include a near-eye display (e.g., a headset or a pair of glasses) configured to present content to a user via an electronic or optic display and, in some cases, may also include a console configured to generate content for presentation to the user and to provide the generated content to the near-eye display for presentation. To improve user interaction with presented content, the console may modify or generate content based on a location where the user is looking, which may be determined by tracking the user's eye. Tracking the eye may include tracking the position and/or shape of the pupil of the eye, and/or the rotational position (gaze direction) of the eye. To track the eye, the near-eye display may illuminate a surface of the user's eye using light sources mounted to or within the near-eye display, according to at least one embodiment. An imaging device (e.g., a camera) included in the vicinity of the near-eye display may then capture light reflected by various surfaces of the user's eye. Light that is reflected specularly off the cornea of the user's eye may result in "glints" in the captured image. One way to illuminate the eye to see the pupil as well as the glints is to use a two-dimensional (2D) array of light-emitting diodes (LEDs). Techniques such as a centroiding algorithm may be used to accurately determine the locations of the glints on the eye in the captured image, and the rotational position (e.g., the gaze direction) of the eye may then be determined based on the locations of the glints relative to a known feature of the eye (e.g., the center of the pupil) within the captured image.

FIG. 1 is a simplified block diagram of an example artificial reality system environment 100 including a near-eye display 120, in accordance with certain embodiments. Artificial reality system environment 100 shown in FIG. 1 may include a near-eye display 120, an external imaging device 150, and an input/output interface 140 that are each coupled to a console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form factor, including a pair of glasses. Additionally, in various embodiments, the functionality described herein may be used in a headset that combines images of an environment external to near-eye display 120 and content received from console 110, or from any other console generating and providing content to a user. Therefore, near-eye display 120, and methods for eye tracking described herein, may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, one or more locators 126, one or more position sensors 128, an eye-tracking unit 130, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display images to the user according to data received from console 110. In various embodiments, display electronics 122 may include one or more display panels, such as a liquid crystal display (LCD), an organic light emitting diode (OLED) display, a micro-LED display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include sub-pixels to emit light of a predominant color such as red, green, blue, white, or yellow. In some implementations, display electronics 122 may display a 3D image through stereo effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers), or magnify image light received from display electronics 122, correct optical errors associated with the image light, and present the corrected image light to a user of near-eye display 120. In various embodiments, display optics 124 may include one or more optical elements. Example optical elements may include a substrate, optical waveguides, an aperture, a Fresnel lens, a convex lens, a concave lens, a filter, or any other suitable optical element that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. In some embodiments, display optics 124 may have an effective focal length larger than the spacing between display optics 124 and display electronics 122 to magnify image light projected by display electronics 122. The amount of magnification of image light by display optics 124 may be adjusted by adding or removing optical elements from display optics 124.

Display optics 124 may be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism. In some embodiments, content provided to display electronics 122 for display may be pre-distorted, and display optics 124 may correct the distortion when it receives image light from display electronics 122 generated based on the pre-distorted content.

Locators 126 may be objects located in specific positions on near-eye display 120 relative to one another and relative to a reference point on near-eye display 120. Console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

In some embodiments, locators 126 may be located beneath an outer surface of near-eye display 120. A portion of near-eye display 120 between a locator 126 and an entity external to near-eye display 120 (e.g., external imaging device 150, a user viewing the outer surface of near-eye display 120) may be transparent to the wavelengths of light emitted or reflected by locators 126 or is thin enough to not substantially attenuate the light emitted or reflected by locators 126. In some embodiments, the outer surface or other portions of near-eye display 120 may be opaque in the visible band, but is transparent in the IR band, and locators 126 may be under the outer surface and may emit light in the IR band.

External imaging device 150 may generate slow calibration data based on calibration parameters received from console 110. Slow calibration data may include one or more images showing observed positions of locators 126 that are detectable by external imaging device 150. External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more imaging devices configured to capture eye tracking data, which an eye-tracking module 118 in console 110 may use to track the user's eye. Eye tracking data may refer to data output by eye-tracking unit 130. Example eye tracking data may include images captured by eye-tracking unit 130 or information derived from the images captured by eye-tracking unit 130. Eye tracking may refer to determining an eye's position, including orientation and location of the eye, relative to near-eye display 120. For example, eye-tracking module 118 may output the eye's pitch and yaw based on images of the eye captured by eye-tracking unit 130. In various embodiments, eye-tracking unit 130 may measure electromagnetic energy reflected by the eye and communicate the measured electromagnetic energy to eye-tracking module 118, which may then determine the eye's position based on the measured electromagnetic energy. For example, eye-tracking unit 130 may measure electromagnetic waves such as visible light, infrared light, radio waves, microwaves, waves in any other part of the electromagnetic spectrum, or a combination thereof reflected by an eye of a user.

Eye-tracking unit 130 may include one or more eye-tracking systems. An eye-tracking system may include an imaging system to image one or more eyes and may optionally include a light emitter, which may generate light that is directed to an eye such that light reflected by the eye may be captured by the imaging system. For example, eye-tracking unit 130 may include a coherent light source (e.g., a VCSEL) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

In some embodiments, eye-tracking unit 130 may include one light emitter and one camera to track each of the user's eyes. In other embodiments, eye-tracking unit 130 may include a plurality of light emitters and one camera to track each of the user's eyes. Eye-tracking unit 130 may also include different eye-tracking systems that operate together to provide improved eye tracking accuracy and responsiveness. For example, eye-tracking unit 130 may include a fast eye-tracking system with a fast response time and a slow eye-tracking system with a slower response time. The fast eye-tracking system may frequently measure an eye to capture data used by eye-tracking module 118 to determine the eye's position relative to a reference eye position. The slow eye-tracking system may independently measure the eye to capture data used by eye-tracking module 118 to determine the reference eye position without reference to a previously determined eye position. Data captured by the slow eye-tracking system may allow eye-tracking module 118 to determine the reference eye position with greater accuracy than the eye's position determined from data captured by the fast eye-tracking system. In various embodiments, the slow eye-tracking system may provide eye-tracking data to eye-tracking module 118 at a lower frequency than the fast eye-tracking system. For example, the slow eye-tracking system may operate less frequently or have a slower response time to conserve power.

Eye-tracking unit 130 may be configured to estimate the orientation of the user's eye. The orientation of the eye may correspond to the direction of the user's gaze within near-eye display 120. The orientation of the user's eye may be defined as the direction of the foveal axis, which is the axis between the fovea (an area on the retina of the eye with the highest concentration of photoreceptors) and the center of the eye's pupil. In general, when a user's eyes are fixed on a point, the foveal axes of the user's eyes intersect that point. The pupillary axis of an eye may be defined as the axis that passes through the center of the pupil and is perpendicular to the corneal surface. In general, even though the pupillary axis and the foveal axis intersect at the center of the pupil, the pupillary axis may not directly align with the foveal axis. For example, the orientation of the foveal axis may be offset from the pupillary axis by approximately −1° to 8° laterally and about ±4° vertically. Because the foveal axis is defined according to the fovea, which is located in the back of the eye, the foveal axis may be difficult or impossible to measure directly in some eye tracking embodiments. Accordingly, in some embodiments, the orientation of the pupillary axis may be detected and the foveal axis may be estimated based on the detected pupillary axis.

In general, the movement of an eye corresponds not only to an angular rotation of the eye, but also to a translation of the eye, a change in the torsion of the eye, and/or a change in the shape of the eye. Eye-tracking unit 130 may also be configured to detect the translation of the eye, which may be a change in the position of the eye relative to the eye socket. In some embodiments, the translation of the eye may not be detected directly, but may be approximated based on a mapping from a detected angular orientation. Translation of the eye corresponding to a change in the eye's position relative to the eye-tracking unit may also be detected. Translation of this type may occur, for example, due to a shift in the position of near-eye display 120 on a user's head. Eye-tracking unit 130 may also detect the torsion of the eye and the rotation of the eye about the pupillary axis. Eye-tracking unit 130 may use the detected torsion of the eye to estimate the orientation of the foveal axis from the pupillary axis. Eye-tracking unit 130 may also track a change in the shape of the eye, which may be approximated as a skew or scaling linear transform or a twisting distortion (e.g., due to torsional deformation). Eye-tracking unit 130 may estimate the foveal axis based on some combinations of the angular orientation of the pupillary axis, the translation of the eye, the torsion of the eye, and the current shape of the eye.

In some embodiments, eye-tracking unit 130 may include multiple emitters or at least one emitter that can project a structured light pattern on all portions or a portion of the eye. The structured light pattern may be distorted due to the shape of the eye when viewed from an offset angle. Eye-tracking unit 130 may also include at least one camera that may detect the distortions (if any) of the structured light pattern projected onto the eye. The camera may be oriented on a different axis to the eye than the emitter. By detecting the deformation of the structured light pattern on the surface of the eye, eye-tracking unit 130 may determine the shape of the portion of the eye being illuminated by the structured light pattern. Therefore, the captured distorted light pattern may be indicative of the 3D shape of the illuminated portion of the eye. The orientation of the eye may thus be derived from the 3D shape of the illuminated portion of the eye. Eye-tracking unit 130 can also estimate the pupillary axis, the translation of the eye, the torsion of the eye, and the current shape of the eye based on the image of the distorted structured light pattern captured by the camera.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect (or the nearest point between the two axes). The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, a virtual reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to VR engine 116.

Headset tracking module 114 may calibrate the artificial reality system environment 100 using one or more calibration parameters, and may adjust one or more calibration parameters to reduce errors in determining the position of near-eye display 120. For example, headset tracking module 114 may adjust the focus of external imaging device 150 to obtain a more accurate position for observed locators on near-eye display 120. Moreover, calibration performed by headset tracking module 114 may also account for information received from IMU 132. Additionally, if tracking of near-eye display 120 is lost (e.g., external imaging device 150 loses line of sight of at least a threshold number of locators 126), headset tracking module 114 may re-calibrate some or all of the calibration parameters.

VR engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. VR engine 116 may also receive estimated eye position and orientation information from eye-tracking module 118. Based on the received information, VR engine 116 may determine content to provide to near-eye display 120 for presentation to the user. For example, if the received information indicates that the user has looked to the left, VR engine 116 may generate content for near-eye display 120 that mirrors the user's eye movement in a virtual environment. Additionally, VR engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some embodiments, eye-tracking unit 130 may output eye-tracking data including images of the eye, and eye-tracking module 118 may determine the eye's position based on the images. For example, eye-tracking module 118 may store a mapping between images captured by eye-tracking unit 130 and eye positions to determine a reference eye position from an image captured by eye-tracking unit 130. Alternatively or additionally, eye-tracking module 118 may determine an updated eye position relative to a reference eye position by comparing an image from which the reference eye position is determined to an image from which the updated eye position is to be determined. Eye-tracking module 118 may determine eye position using measurements from different imaging devices or other sensors. For example, as described above, eye-tracking module 118 may use measurements from a slow eye-tracking system to determine a reference eye position, and then determine updated positions relative to the reference eye position from a fast eye-tracking system until a next reference eye position is determined based on measurements from the slow eye-tracking system.

Eye-tracking module 118 may also determine eye calibration parameters to improve precision and accuracy of eye tracking. Eye calibration parameters may include parameters that may change whenever a user dons or adjusts near-eye display 120. Example eye calibration parameters may include an estimated distance between a component of eye-tracking unit 130 and one or more parts of the eye, such as the eye's center, pupil, cornea boundary, or a point on the surface of the eye. Other example eye calibration parameters may be specific to a particular user and may include an estimated average eye radius, an average corneal radius, an average sclera radius, a map of features on the eye surface, and an estimated eye surface contour. In embodiments where light from the outside of near-eye display 120 may reach the eye (as in some augmented reality applications), the calibration parameters may include correction factors for intensity and color balance due to variations in light from the outside of near-eye display 120. Eye-tracking module 118 may use eye calibration parameters to determine whether the measurements captured by eye-tracking unit 130 would allow eye-tracking module 118 to determine an accurate eye position (also referred to herein as "valid measurements"). Invalid measurements, from which eye-tracking module 118 may not be able to determine an accurate eye position, may be caused by the user blinking, adjusting the headset, or removing the headset, and/or may be caused by near-eye display 120 experiencing greater than a threshold change in illumination due to external light.

Figure 2:
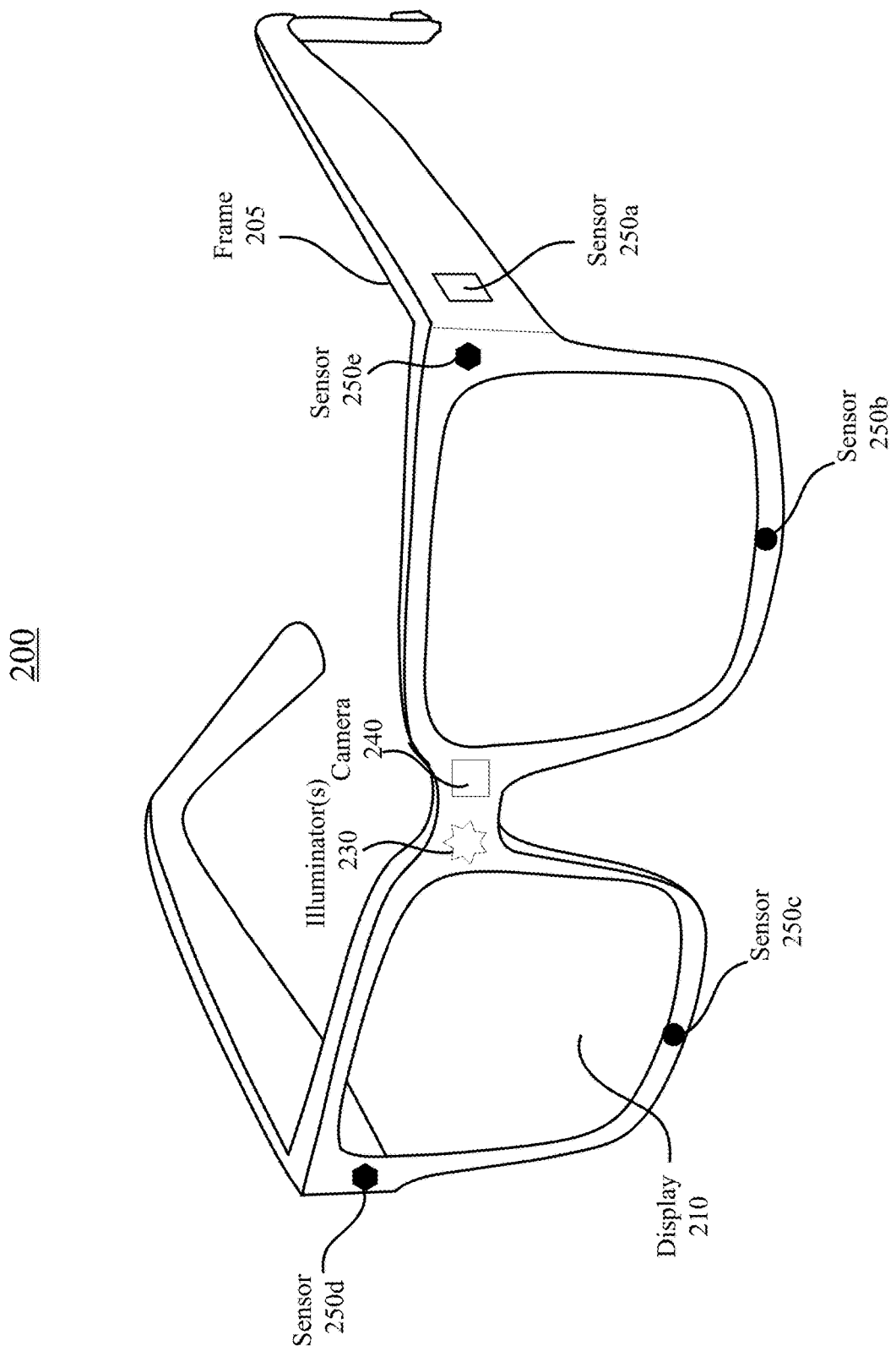
FIG. 2 is a perspective view of a simplified example near-eye display including various sensors.

FIG. 2 is a perspective view of a simplified example near-eye display 200 including various sensors. Near-eye display 200 may be a specific implementation of near-eye display 120 of FIG. 1, and may be configured to operate as a virtual reality display, an augmented reality display, and/or a mixed reality display. Near-eye display 200 may include a frame 205 and a display 210. Display 210 may be configured to present content to a user. In some embodiments, display 210 may include display electronics and/or display optics. For example, as described above with respect to near-eye display 120 of FIG. 1, display 210 may include an LCD display panel, an LED display panel, or an optical display panel (e.g., a waveguide display assembly).

Near-eye display 200 may further include various sensors 250a, 250b, 250c, 250d, and 250e on or within frame 205. In some embodiments, sensors 250a-250e may include one or more depth sensors, motion sensors, position sensors, inertial sensors, or ambient light sensors. In some embodiments, sensors 250a-250e may include one or more image sensors configured to generate image data representing different fields of views in different directions. In some embodiments, sensors 250a-250e may be used as input devices to control or influence the displayed content of near-eye display 200, and/or to provide an interactive VR/AR/MR experience to a user of near-eye display 200. In some embodiments, sensors 250a-250e may also be used for stereoscopic imaging.

In some embodiments, near-eye display 200 may further include one or more illuminators 230 to project light into the physical environment. The projected light may be associated with different frequency bands (e.g., visible light, infra-red light, ultra-violet light, etc.), and may serve various purposes. For example, illuminator(s) 230 may project light in a dark environment (or in an environment with low intensity of infra-red light, ultra-violet light, etc.) to assist sensors 250a-250e in capturing images of different objects within the dark environment. In some embodiments, illuminator(s) 230 may be used to project certain light pattern onto the objects within the environment. In some embodiments, illuminator(s) 230 may be used as locators, such as locators 126 described above with respect to FIG. 1.

In some embodiments, near-eye display 200 may also include a high-resolution camera 240. Camera 240 may capture images of the physical environment in the field of view. The captured images may be processed, for example, by a virtual reality engine (e.g., virtual reality engine 116 of FIG. 1) to add virtual objects to the captured images or modify physical objects in the captured images, and the processed images may be displayed to the user by display 210 for AR or MR applications.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 3:
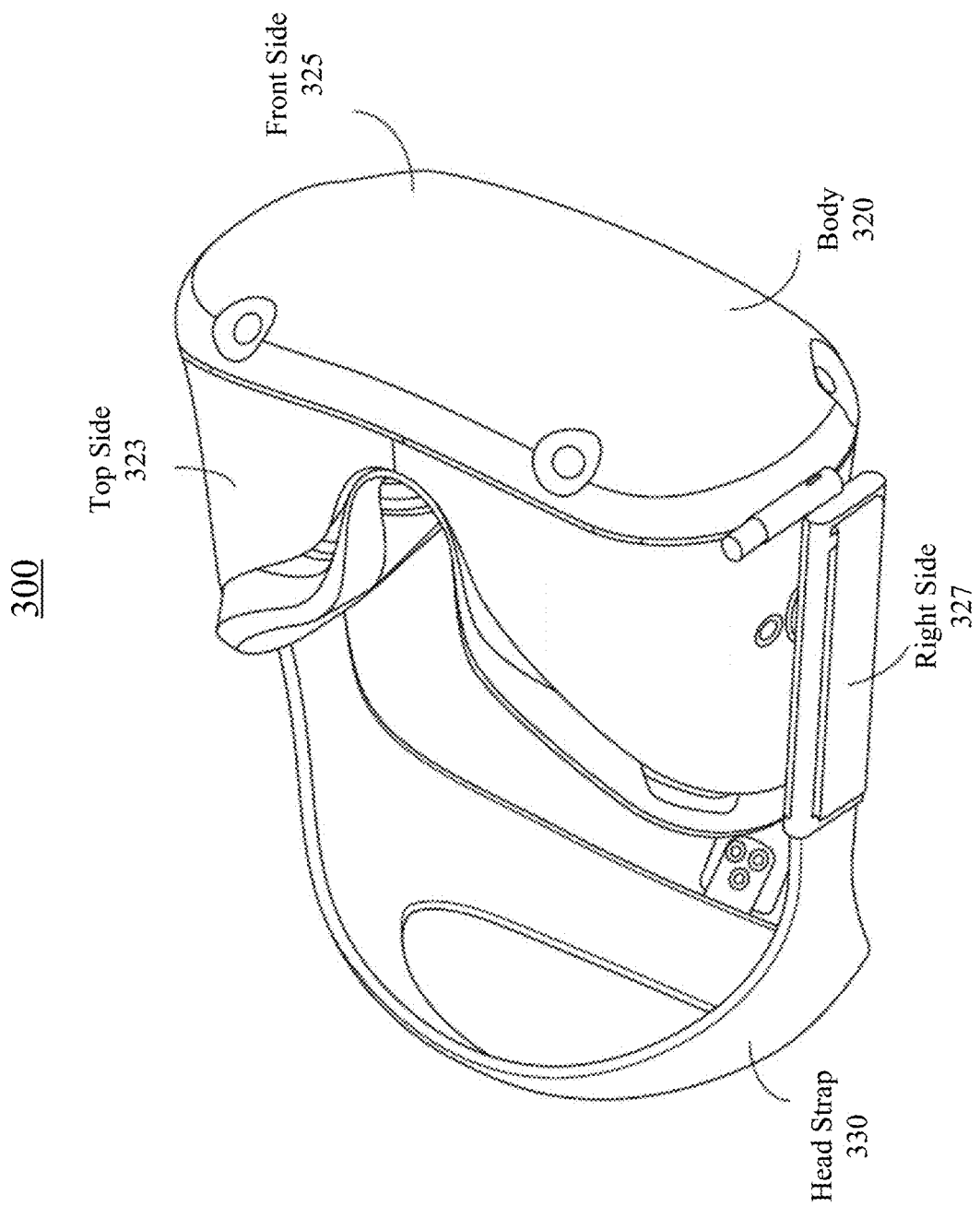
FIG. 3 is a perspective view of an example near-eye display in the form of a head-mounted display (HMD) device for implementing some of the examples disclosed herein.

FIG. 3 is a perspective view of an example near-eye display in the form of a head-mounted display (HMD) device 300 for implementing some of the example near-eye displays (e.g., near-eye display 120) disclosed herein. HMD device 300 may be a part of, e.g., a virtual reality (VR) system, an augmented reality (AR) system, a mixed reality (MR) system, or some combinations thereof. HMD device 300 may include a body 320 and a head strap 330. FIG. 3 shows a top side 323, a front side 325, and a right side 327 of body 320 in the perspective view. Head strap 330 may have an adjustable or extendible length. There may be a sufficient space between body 320 and head strap 330 of HMD device 300 for allowing a user to mount HMD device 300 onto the user's head. In various embodiments, HMD device 300 may include additional, fewer, or different components. For example, in some embodiments, HMD device 300 may include eyeglass temples and temples tips, rather than head strap 330.

HMD device 300 may present to a user media including virtual and/or augmented views of a physical, real-world environment with computer-generated elements. Examples of the media presented by HMD device 300 may include images (e.g., two-dimensional (2D) or three-dimensional (3D) images), videos (e.g., 2D or 3D videos), audios, or some combinations thereof. The images and videos may be presented to each eye of the user by one or more display assemblies (not shown in FIG. 3) enclosed in body 320 of HMD device 300. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro-LED display, an active-matrix organic light emitting diode (AMOLED) display, a transparent organic light emitting diode (TOLED) display, some other display, or some combinations thereof. HMD device 300 may include two eye box regions.

In some implementations, HMD device 300 may include various sensors (not shown), such as depth sensors, motion sensors, position sensors, and eye tracking sensors. Some of these sensors may use a structured light pattern for sensing. In some implementations, HMD device 300 may include an input/output interface for communicating with a console. In some implementations, HMD device 300 may include a virtual reality engine (not shown) that can execute applications within HMD device 300 and receive depth information, position information, acceleration information, velocity information, predicted future positions, or some combination thereof of HMD device 300 from the various sensors. In some implementations, the information received by the virtual reality engine may be used for producing a signal (e.g., display instructions) to the one or more display assemblies. In some implementations, HMD device 300 may include locators (not shown, such as locators 126) located in fixed positions on body 320 relative to one another and relative to a reference point. Each of the locators may emit light that is detectable by an external imaging device.

Figure 4:
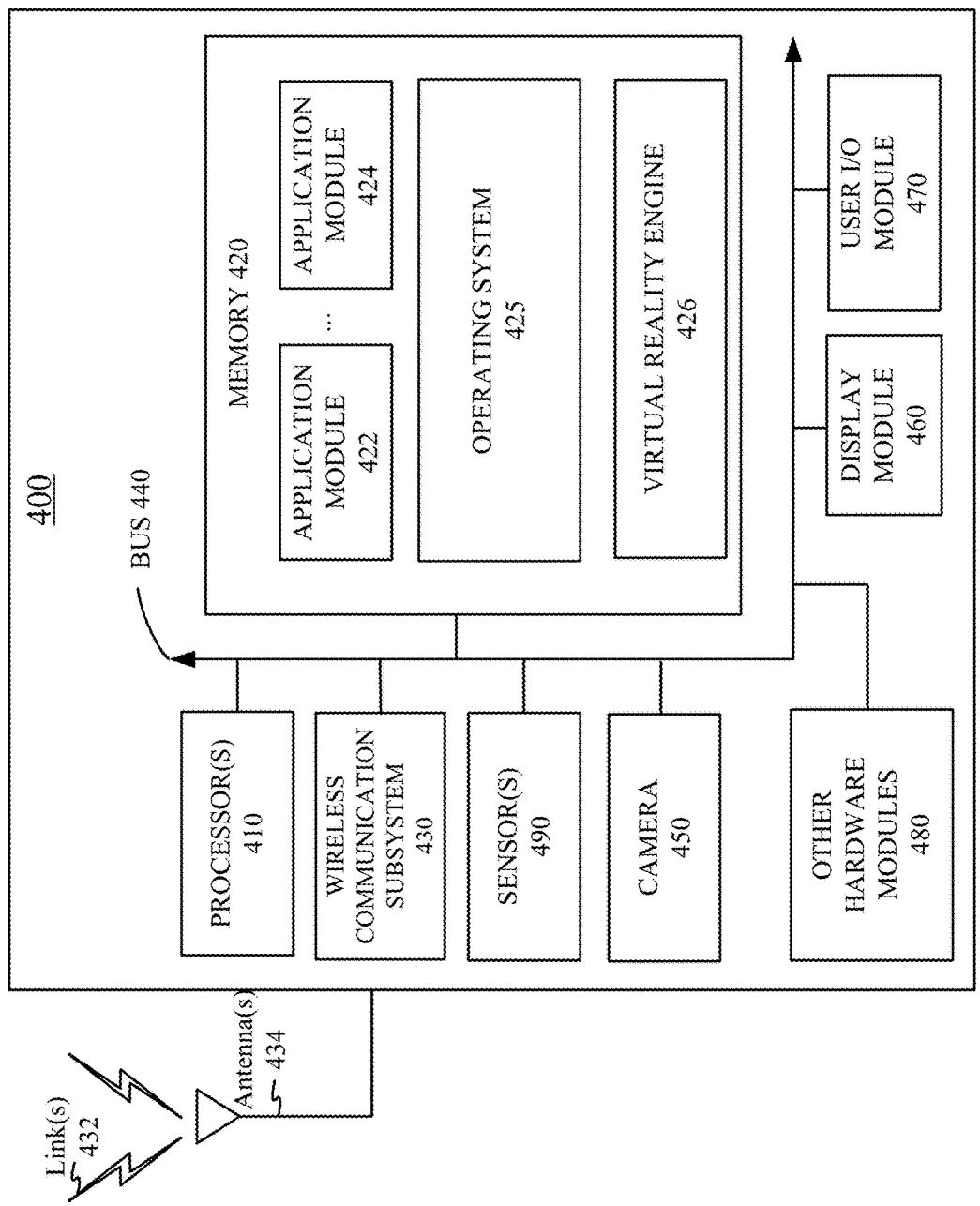
FIG. 4 is a simplified block diagram of an example electronic system of an example near-eye display for implementing some of the examples disclosed herein.

FIG. 4 is a simplified block diagram of an example electronic system 400 of an example near-eye display (e.g., HMD device) for implementing some of the examples disclosed herein. Electronic system 400 may be used as the electronic system of HMD device 1000 or other near-eye displays described above. In this example, electronic system 400 may include one or more processor(s) 410 and a memory 420. Processor(s) 410 may be configured to execute instructions for performing operations at a number of components, and can be, for example, a general-purpose processor or microprocessor suitable for implementation within a portable electronic device. Processor(s) 410 may be communicatively coupled with a plurality of components within electronic system 400. To realize this communicative coupling, processor(s) 410 may communicate with the other illustrated components across a bus 440. Bus 440 may be any subsystem adapted to transfer data within electronic system 400. Bus 440 may include a plurality of computer buses and additional circuitry to transfer data.

Memory 420 may be coupled to processor(s) 410. In some embodiments, memory 420 may offer both short-term and long-term storage and may be divided into several units. Memory 420 may be volatile, such as static random access memory (SRAM) and/or dynamic random access memory (DRAM) and/or non-volatile, such as read-only memory (ROM), flash memory, and the like. Furthermore, memory 420 may include removable storage devices, such as secure digital (SD) cards. Memory 420 may provide storage of computer-readable instructions, data structures, program modules, and other data for electronic system 400. In some embodiments, memory 420 may be distributed into different hardware modules. A set of instructions and/or code might be stored on memory 420. The instructions might take the form of executable code that may be executable by electronic system 400, and/or might take the form of source and/or installable code, which, upon compilation and/or installation on electronic system 400 (e.g., using any of a variety of generally available compilers, installation programs, compression/decompression utilities, etc.), may take the form of executable code.

In some embodiments, memory 420 may store a plurality of application modules 422 through 424, which may include any number of applications. Examples of applications may include gaming applications, conferencing applications, video playback applications, or other suitable applications. The applications may include a depth sensing function or eye tracking function. Application modules 422-424 may include particular instructions to be executed by processor(s) 410. In some embodiments, certain applications or parts of application modules 422-424 may be executable by other hardware modules 480. In certain embodiments, memory 420 may additionally include secure memory, which may include additional security controls to prevent copying or other unauthorized access to secure information.

In some embodiments, memory 420 may include an operating system 425 loaded therein. Operating system 425 may be operable to initiate the execution of the instructions provided by application modules 422-424 and/or manage other hardware modules 480 as well as interfaces with a wireless communication subsystem 430 which may include one or more wireless transceivers. Operating system 425 may be adapted to perform other operations across the components of electronic system 400 including threading, resource management, data storage control and other similar functionality.

Wireless communication subsystem 430 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 400 may include one or more antennas 434 for wireless communication as part of wireless communication subsystem 430 or as a separate component coupled to any portion of the system. Depending on desired functionality, wireless communication subsystem 430 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 430 may permit data to be exchanged with a network, other computer systems, and/or any other devices described herein. Wireless communication subsystem 430 may include a means for transmitting or receiving data, such as identifiers of HMD devices, position data, a geographic map, a heat map, photos, or videos, using antenna(s) 434 and wireless link(s) 432. Wireless communication subsystem 430, processor(s) 410, and memory 420 may together comprise at least a part of one or more of a means for performing some functions disclosed herein.

Embodiments of electronic system 400 may also include one or more sensors 490. Sensor(s) 490 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 490 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 400 may include a display module 460. Display module 460 may be a near-eye display, and may graphically present information, such as images, videos, and various instructions, from electronic system 400 to a user. Such information may be derived from one or more application modules 422-424, virtual reality engine 426, one or more other hardware modules 480, a combination thereof, or any other suitable means for resolving graphical content for the user (e.g., by operating system 425). Display module 460 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 400 may include a user input/output module 470. User input/output module 470 may allow a user to send action requests to electronic system 400. An action request may be a request to perform a particular action. For example, an action request may be to start or end an application or to perform a particular action within the application. User input/output module 470 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 400. In some embodiments, user input/output module 470 may provide haptic feedback to the user in accordance with instructions received from electronic system 400. For example, the haptic feedback may be provided when an action request is received or has been performed.

Electronic system 400 may include a camera 450 that may be used to take photos or videos of a user, for example, for tracking the user's eye position. Camera 450 may also be used to take photos or videos of the environment, for example, for VR, AR, or MR applications. Camera 450 may include, for example, a complementary metal-oxide-semiconductor (CMOS) image sensor with a few millions or tens of millions of pixels. In some implementations, camera 450 may include two or more cameras that may be used to capture 3-D images.

In some embodiments, electronic system 400 may include a plurality of other hardware modules 480. Each of other hardware modules 480 may be a physical module within electronic system 400. While each of other hardware modules 480 may be permanently configured as a structure, some of other hardware modules 480 may be temporarily configured to perform specific functions or temporarily activated. Examples of other hardware modules 480 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 480 may be implemented in software.

In some embodiments, memory 420 of electronic system 400 may also store a virtual reality engine 426. Virtual reality engine 426 may execute applications within electronic system 400 and receive position information, acceleration information, velocity information, predicted future positions, or some combination thereof of the HMD device from the various sensors. In some embodiments, the information received by virtual reality engine 426 may be used for producing a signal (e.g., display instructions) to display module 460. For example, if the received information indicates that the user has looked to the left, virtual reality engine 426 may generate content for the HMD device that mirrors the user's movement in a virtual environment. Additionally, virtual reality engine 426 may perform an action within an application in response to an action request received from user input/output module 470 and provide feedback to the user. The provided feedback may be visual, audible, or haptic feedback. In some implementations, processor(s) 410 may include one or more GPUs that may execute virtual reality engine 426.

In various implementations, the above-described hardware and modules may be implemented on a single device or on multiple devices that can communicate with one another using wired or wireless connections. For example, in some implementations, some components or modules, such as GPUs, virtual reality engine 426, and applications (e.g., tracking application), may be implemented on a console separate from the head-mounted display device. In some implementations, one console may be connected to or support more than one HMD.

In alternative configurations, different and/or additional components may be included in electronic system 400. Similarly, functionality of one or more of the components can be distributed among the components in a manner different from the manner described above. For example, in some embodiments, electronic system 400 may be modified to include other system environments, such as an AR system environment and/or an MR environment.

As discussed above, LEDs may be used as light sources in various parts of an artificial reality system, such as the display electronics 122, the locators 126, and the eye tracking unit 130. Further, LEDs may be used in various display technologies, such as heads-up displays, television displays, smartphone displays, watch displays, wearable displays, and flexible displays. LEDs can be used in combination with a plurality of sensors in many applications such as the Internet of Things (IOT). The LEDs described herein can be configured to emit light having any desired wavelength, such as ultraviolet, visible, or infrared light. Also, the LEDs described herein can be configured to have any suitable mesa shape, such as planar, vertical, conical, semi-parabolic, parabolic, or combinations thereof. The LEDs described herein may be micro-LEDs that have an active light emitting area with a linear dimension that is less than 50 µm, less than 20 µm, or less than 10 µm. For example, the linear dimension may be as small as 2 µm or 4 µm.

Figure 5A:
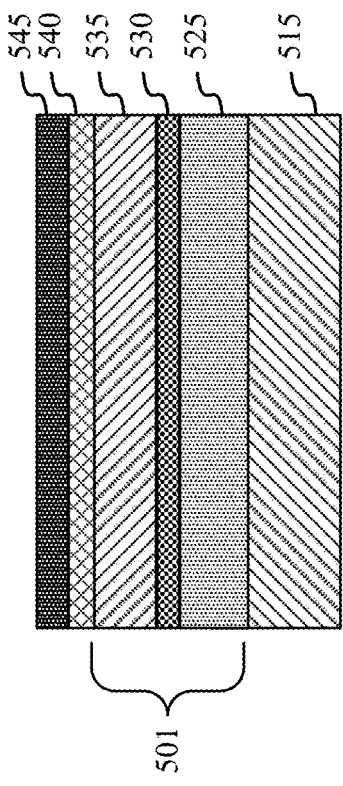
FIGS. 5A-5F illustrate a method of wafer-to-wafer bonding for manufacturing LEDs.

FIGS. 5A-5F illustrate a method of wafer-to-wafer bonding for manufacturing LEDs. As shown in FIG. 5A, the method begins with a structure having a substrate 515 and a semiconductor material 501. Semiconductor material 501 may include a plurality of epitaxial layers that are grown by any suitable epitaxial method on substrate 515. For example, semiconductor material 501 may include an n-type layer 525, a quantum well layer 530, and a p-type layer 535. Substrate 515 may be made of any material that is suitable for growing semiconductor material 501. For example, substrate 515 may be made of sapphire, and semiconductor material 501 may be made of GaN. Other layers may also be included, such as a buffer layer between substrate 515 and n-type layer 525. The buffer layer may be made of any suitable material, such as polycrystalline GaN or AlN, and may have a thickness of less than 50 nm.

Figure 5B:
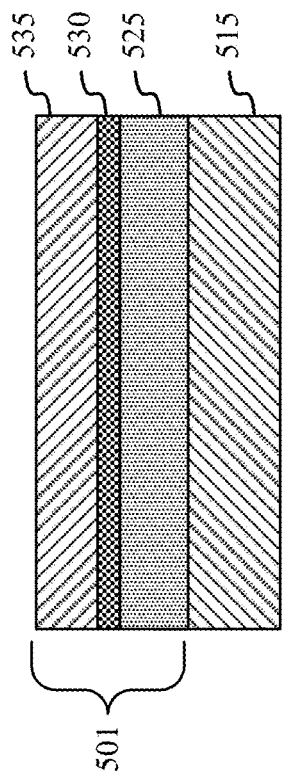

As shown in FIG. 5B, a contact layer 540 may be deposited on p-type layer 535 of semiconductor material 501. Contact layer 540 may be made of any suitable material for providing an electrical contact to semiconductor material 501, such as a metal. Further, contact layer 540 may be optimized to have a high reflectivity. A bonding layer 545 may be deposited on contact layer 540. Bonding layer 545 may be made of any suitable material for providing a bond to semiconductor material 501, such as a metal. Contact layer 540 and bonding layer 545 may be made of different materials or the same material. Contact layer 540 and bonding layer 545 may be included in a single layer that is deposited on p-type layer 535, or they may be separate layers as shown in FIG. 5B.

Figure 5C:
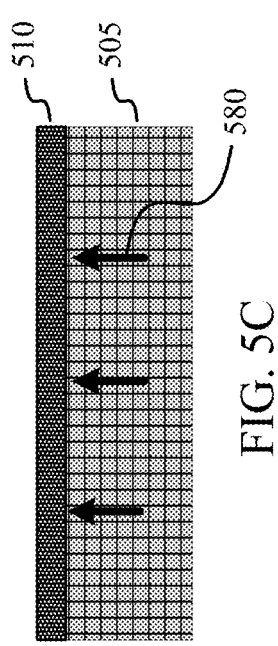

As shown in FIG. 5C, another structure including a base wafer 505 and a bonding layer 510 may be provided. Base wafer 505 may be an Application-Specific Integrated Circuit (ASIC) wafer, and may include a plurality of driver circuits 580. Bonding layer 510 may be made of any suitable material for providing a bond to base wafer 505, such as a metal.

Figure 5D:
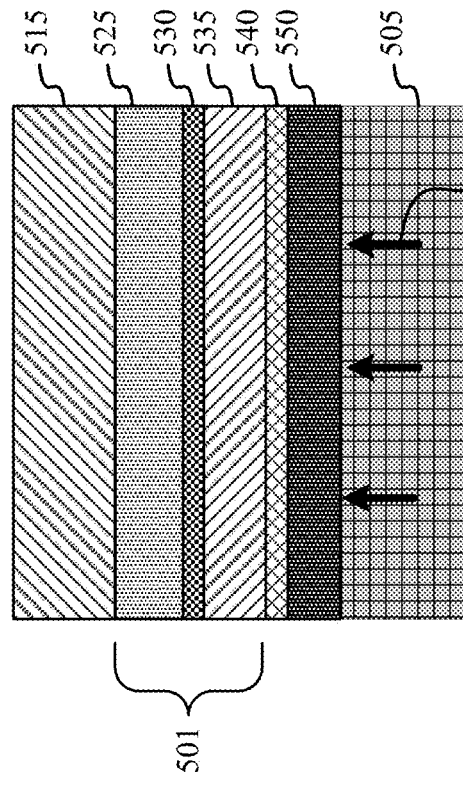

As shown in FIG. 5D, base wafer 505 may be bonded to semiconductor material 501 via bonding layer 510 and/or bonding layer 545. Bonding layer 510 and bonding layer 545 may be made of the same material. This example is shown in FIG. 5D, in which the combination of bonding layer 510 and bonding layer 545 is shown as bonding layer 550. Alternatively, bonding layer 510 and bonding layer 545 may be made of different materials. Base wafer 505 may be bonded to semiconductor material 501 by various methods, as discussed in further detail below.

Figure 5F:
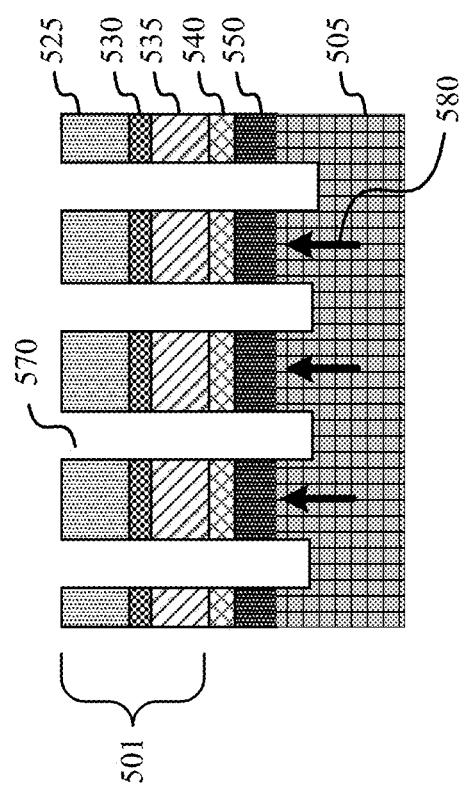
Figure 5E:
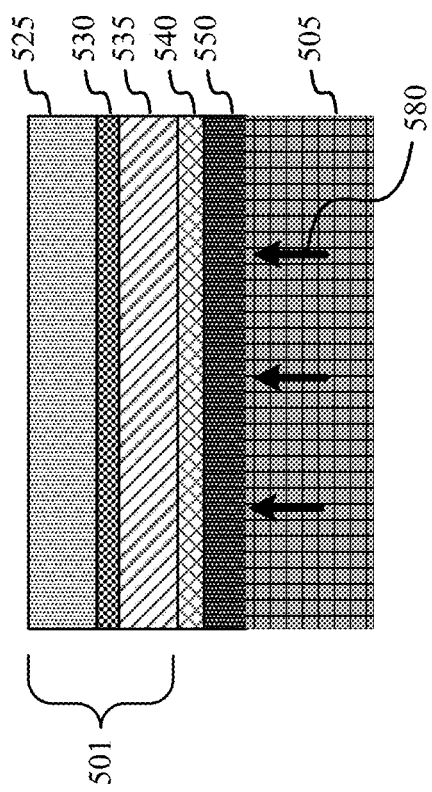

As shown in FIG. 5E, substrate 515 may be removed from semiconductor material 501. Substrate 515 may be removed by any suitable method, such as laser lift-off (LLO). For example, substrate 515 may be removed by focusing a laser beam at an interface between substrate 515 and semiconductor material 501. Alternatively or in addition, substrate 515 may be removed by heating substrate 515 and/or applying a horizontal force to substrate 515.

As shown in FIG. 5F, trenches 570 may be formed through semiconductor material 501, contact layer 540, bonding layer 550, and part of base wafer 505. Trenches 570 may be formed by any suitable method, such as lithography. The pattern of trenches 570 may be based on the locations of driver circuits 580, such that trenches 570 do not interfere with driver circuits 580 and are not vertically aligned with driver circuits 580. The resulting structure includes a plurality of LEDs that are separated by trenches 570. As shown in FIG. 5F, the LEDs may have vertical side walls. For example, the LEDs may have cylindrically shaped mesas.

Figure 6B:
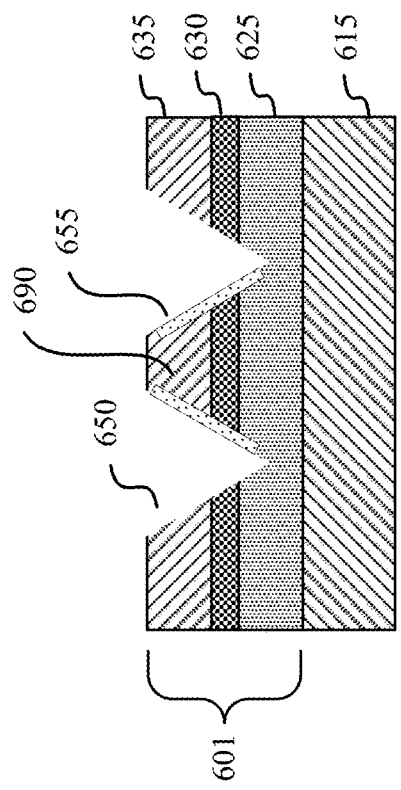
FIGS. 6A-6J illustrate another method of wafer-to-wafer bonding for manufacturing LEDs.
Figure 6D:
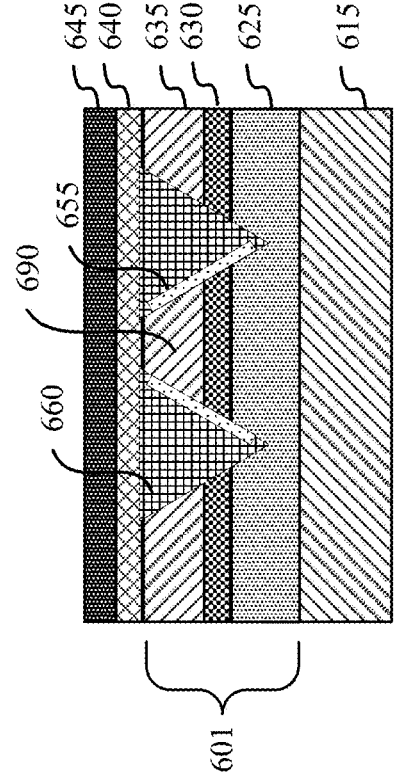
Figure 6A:
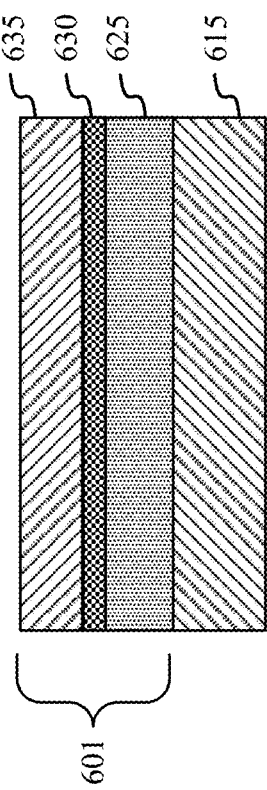

FIGS. 6A-6I illustrate another method of wafer-to-wafer bonding for manufacturing LEDs. As shown in FIG. 6A, the method begins with a structure having a substrate 615 and a semiconductor material 601. Semiconductor material 601 may include a plurality of epitaxial layers that are grown by any suitable epitaxial method on substrate 615. For example, semiconductor material 601 may include an n-type layer 625, a quantum well layer 630, and a p-type layer 635. Substrate 615 may be made of any material that is suitable for growing semiconductor material 601. For example, substrate 615 may be made of sapphire, and semiconductor material 601 may be made of GaN. Other layers may also be included, such as a buffer layer between substrate 615 and n-type layer 625. The buffer layer may be made of any suitable material, such as polycrystalline GaN or AlN, and may have a thickness of less than 50 nm.

As shown in FIG. 6B, a plurality of adjacent mesa shapes 690 may be formed by patterning a plurality of gaps 650 in semiconductor material 601. The patterning may be performed by any suitable method, such as anisotropic etching. The shape of mesa shapes 690 may be chosen to increase or optimize the amount of light that is extracted from corresponding LEDs once fabrication of the LEDs is complete. For example, mesa shapes 690 may be formed to have a parabolic shape or another non-vertical shape. A reflective layer 655 may be formed on at least one side wall of each mesa shape 690. Reflective layer 655 may be made of any suitable material, such as silver or gold. Reflective layer 655 may be formed by any suitable method, such as evaporation or sputtering.

Figure 6C:
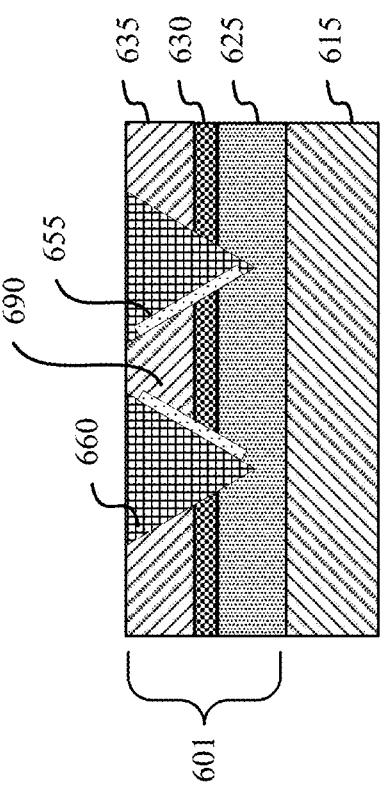

As shown in FIG. 6C, a passivation layer 660 may be formed within gaps 650 between adjacent mesa shapes 690. Passivation layer 660 may be made of any suitable material, such as an oxide. Passivation layer 660 may be used to provide a flat bonding surface. For example, after passivation layer 660 has been deposited within gaps 650, the passivation layer 660 may be polished back to be flat and to expose the p-type layer 635. Alternatively, a thin layer of passivation layer 660 and p-type layer 635 may be removed to form the flat bonding surface. In other embodiments, grinding and/or chemical etching may be used to form the flat bonding surface. Alternatively or in addition, any other suitable method may be used to planarize passivation layer 660 and p-type layer 635.

As shown in FIG. 6D, a contact layer 640 may be deposited on p-type layer 635 of semiconductor material 601 and passivation layer 660. Contact layer 640 may be made of any suitable material for providing an electrical contact to semiconductor material 601, such as a metal. Further, contact layer 640 may be optimized to have a high reflectivity. As an alternative the contact layer 640 may be deposited prior to the formation of mesa shapes 690. In this example, the passivation layer 660 may be polished back to be flat and to expose the contact layer 640. A bonding layer 645 may be deposited on contact layer 640. Bonding layer 645 may be made of any suitable material for providing a bond to semiconductor material 601, such as a metal. Contact layer 640 and bonding layer 645 may be made of different materials or the same material. Contact layer 640 and bonding layer 645 may be included in a single layer that is deposited on p-type layer 635 and passivation layer 660, or they may be separate layers as shown in FIG. 6D.

Figure 6F:
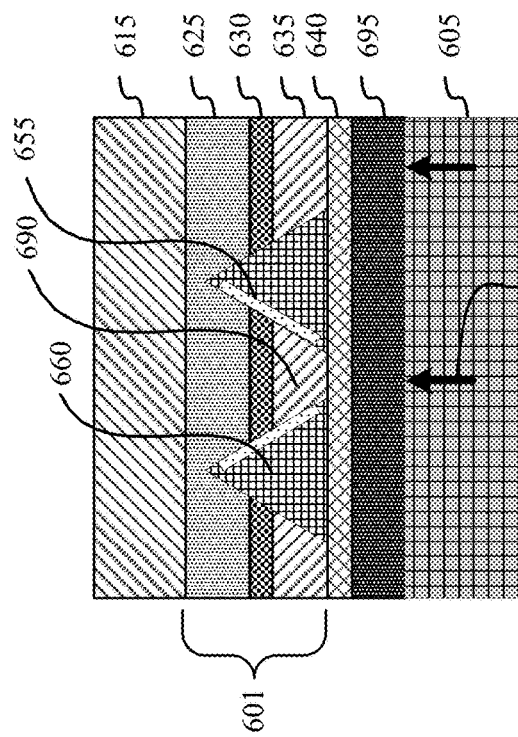
Figure 6H:
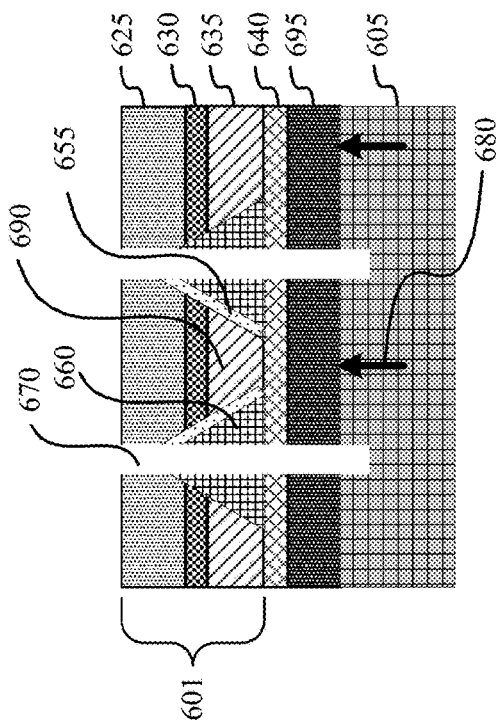
Figure 6E:
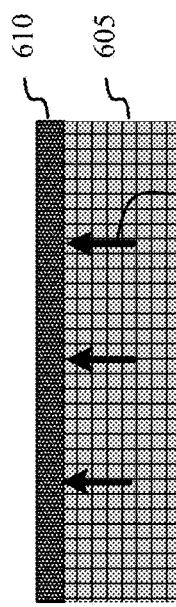

As shown in FIG. 6E, another structure including a base wafer 605 and a bonding layer 610 may be provided. Base wafer 605 may be an ASIC wafer, and may include a plurality of driver circuits 680. Bonding layer 610 may be made of any suitable material for providing a bond to base wafer 605, such as a metal.

As shown in FIG. 6F, base wafer 605 may be bonded to semiconductor material 601 via bonding layer 610 and/or bonding layer 645. Bonding layer 610 and bonding layer 645 may be made of the same material. This example is shown in FIG. 6F, in which the combination of bonding layer 610 and bonding layer 645 is shown as bonding layer 695. Alternatively, bonding layer 610 and bonding layer 645 may be made of different materials. Base wafer 605 may be bonded to semiconductor material 601 by various methods, as discussed in further detail below. During bonding, base wafer 605 may be aligned with semiconductor material 601 such that driver circuits 680 are aligned with adjacent mesa shapes 690.

Figure 6G:
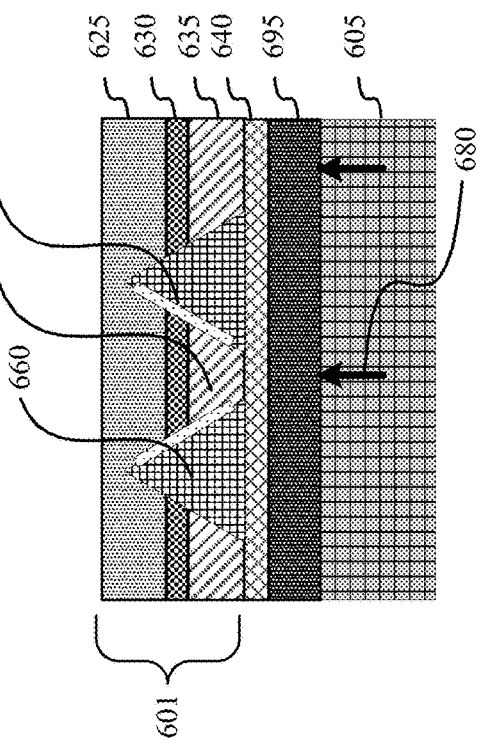

As shown in FIG. 6G, substrate 615 may be removed from semiconductor material 601. Substrate 615 may be removed by any suitable method, such as laser lift-off (LLO). For example, substrate 615 may be removed by focusing a laser beam at an interface between substrate 615 and semiconductor material 601. Alternatively or in addition, substrate 615 may be removed by heating substrate 615 and/or applying a horizontal force to substrate 615.

As shown in FIG. 6H, trenches 670 may be formed through semiconductor material 601, contact layer 640, and bonding layer 695. Trenches 670 may be formed by any suitable method, such as lithography. Trenches 670 may be used to singulate LEDs, and may be formed such that trenches 670 do not interfere with driver circuits 680 and are not vertically aligned with driver circuits 680. The resulting structure includes a plurality of LEDs that are separated by trenches 670. As shown in FIG. 6H, the LEDs may have non-vertical side walls.

Figure 6J:
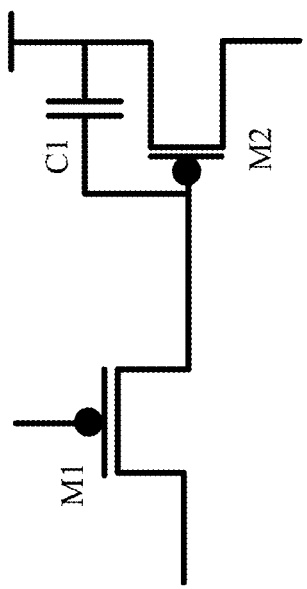
Figure 6I:
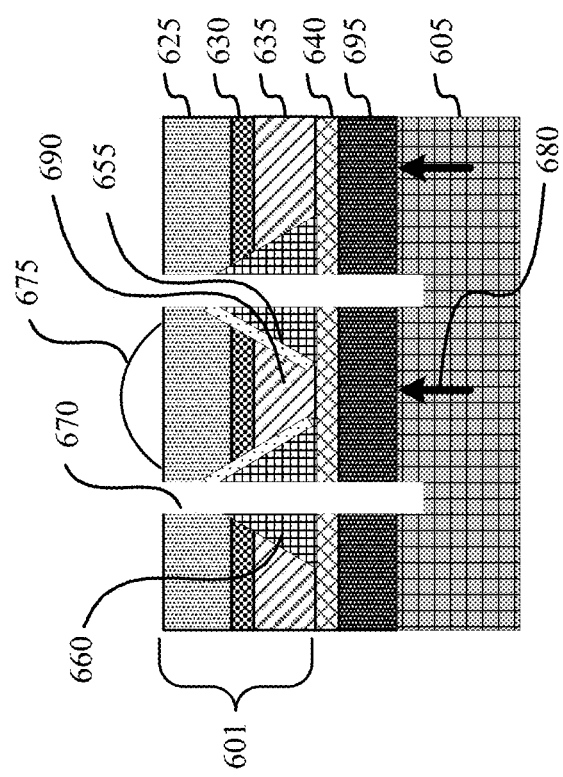

As shown in FIG. 6I, a lens 675 may be formed at a light exit surface of each LED. Lens 675 may increase the light extraction efficiency and decrease the emission cone of the LED. For example, the light extraction efficiency of each LED shown in FIG. 6I may be at least 85% and the beam angle may be less than 40°. Alternatively, other light extraction features may be formed at the light exit surface of each LED, such as roughening of the light exit surface. Some examples of other light extraction features include graded index optics, Fresnel lenses, diffractive gratings, photonic crystals, and anti-reflection (AR) coatings. Alternatively other features may be formed to increase the spontaneous emission rate.

FIG. 6J shows an example of a 2T1C pixel structure that may be used in the base wafer 605. The 2T1C pixel structure may include two transistors M1 and M2, along with a capacitor C1. The 2T1C pixel structure is an example of the driver circuit 680.

Figure 7E:
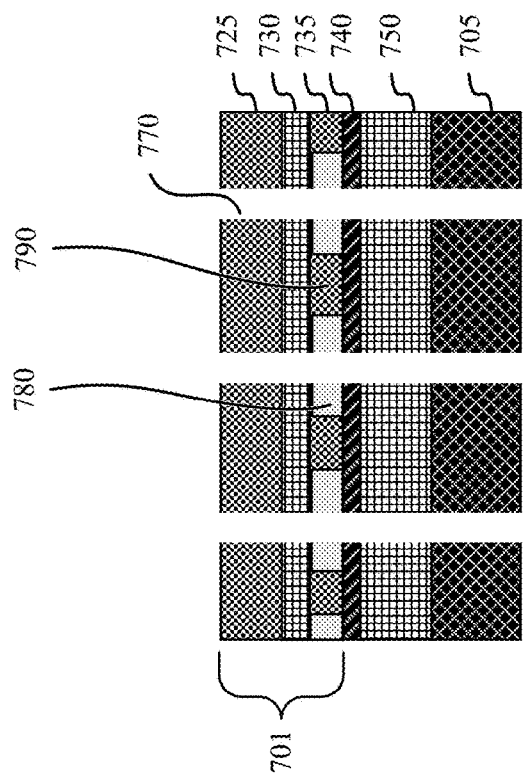

FIGS. 7A-7F illustrate yet another method of wafer-to-wafer bonding for manufacturing LEDs. As shown in FIG. 7A, the method begins with a structure having a substrate 715 and a semiconductor material 701. Semiconductor material 701 may include a plurality of epitaxial layers that are grown by any suitable epitaxial method on substrate 715. For example, semiconductor material 701 may include an n-type layer 725, a quantum well layer 730, and a p-type layer 735. Substrate 715 may be made of any material that is suitable for growing semiconductor material 701. For example, substrate 715 may be made of sapphire, and semiconductor material 701 may be made of GaN. Other layers may also be included, such as a buffer layer 720 between substrate 715 and n-type layer 725. Buffer layer 720 may be made of any suitable material, such as polycrystalline GaN or AlN, and may have a thickness of less than 50 nm.

As shown in FIG. 7B, a plurality of high resistivity areas alternating with a plurality of low resistivity areas may be formed by patterning of p-type layer 735 of semiconductor material 701. The high resistivity areas have a higher resistivity than the low resistivity areas. Once p-type layer 735 has been patterned, p-type layer 735 includes a plurality of light emitters 790 (corresponding to the low resistivity areas) that alternate with a plurality of high resistivity areas 780. The patterning may be performed by any suitable method, such as plasma treatment or ion implantation. For example, lithography may be used to treat selected areas of p-type layer 735 with plasma in order to increase the resistivity in those areas. The depth of the treatment may extend through the entire p-layer 735, and may not extend into quantum well layer 730. The light emitters 790 may be designed to increase the light extraction of the structure by aligning the light emitters 790 with the light extraction features discussed above. The p-type layer 735 may be polished back to be flat in order to provide a flat bonding surface. Alternatively, a thin slice of p-type layer 735 may be removed to form the flat bonding surface. In other embodiments, grinding and/or chemical etching may be used to form the flat bonding surface. Alternatively or in addition, any other suitable method may be used to planarize p-type layer 735. Arrows 795 represent current flow, and show that current does not flow between adjacent light emitters 790.

As shown in FIG. 7C, a contact layer 740 may be deposited on p-type layer 735 of semiconductor material 701. Contact layer 740 may be made of any suitable material for providing an electrical contact to semiconductor material 701, such as a metal. As an alternative contact layer 740 may be deposited prior to the formation of light emitters 790. Further, contact layer 740 may be optimized to have a high reflectivity. A bonding layer 745 may be deposited on contact layer 740. Bonding layer 745 may be made of any suitable material for providing a bond to semiconductor material 701, such as a metal. Contact layer 740 and bonding layer 745 may be made of different materials or the same material. Contact layer 740 and bonding layer 745 may be included in a single layer that is deposited on p-type layer 735, or they may be separate layers as shown in FIG. 7C.

As shown in FIG. 7D, a base wafer 705 may be bonded to semiconductor material 701 via bonding layer 750. Base wafer 705 may be an ASIC wafer, and may include a plurality of driver circuits 785. Bonding layer 745 and bonding layer 750 may be made of the same material. Bonding layer 750 may include bonding layer 745. Base wafer 705 may be bonded to semiconductor material 701 by various methods, as discussed in further detail below. During bonding, base wafer 705 may be aligned with semiconductor material 701 such that driver circuits 785 are aligned with adjacent light emitters 790.

As shown in FIG. 7E, substrate 715 may be removed from semiconductor material 701. Substrate 715 may be removed by any suitable method, such as laser lift-off (LLO). For example, substrate 715 may be removed by focusing a laser beam at an interface between substrate 715 and semiconductor material 701. Alternatively or in addition, substrate 715 may be removed by heating substrate 715 and/or applying a horizontal force to substrate 715.

Figure 7F:
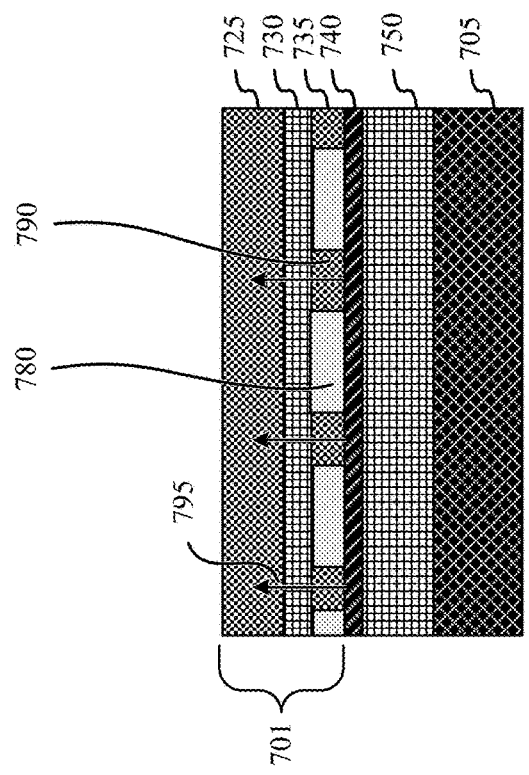

As shown in FIG. 7F, trenches 770 may be formed through semiconductor material 701, contact layer 740, bonding layer 750, and base wafer 705 in order to singulate the LEDs. Alternatively, trenches 770 may be formed partially through base wafer 705 in order to singulate the LEDs. As another alternative, base wafer 705 may be partially etched to determine the LED array size and etched all the way through in order to isolate each LED array. Trenches 770 may be formed between adjacent light emitters 790 such that individual LEDs are formed. Trenches 770 may be formed by any suitable method, such as lithography. The resulting structure includes a plurality of LEDs that are separated by trenches 770. As shown in FIG. 7F, the LEDs may have vertical side walls.

Figure 7G:
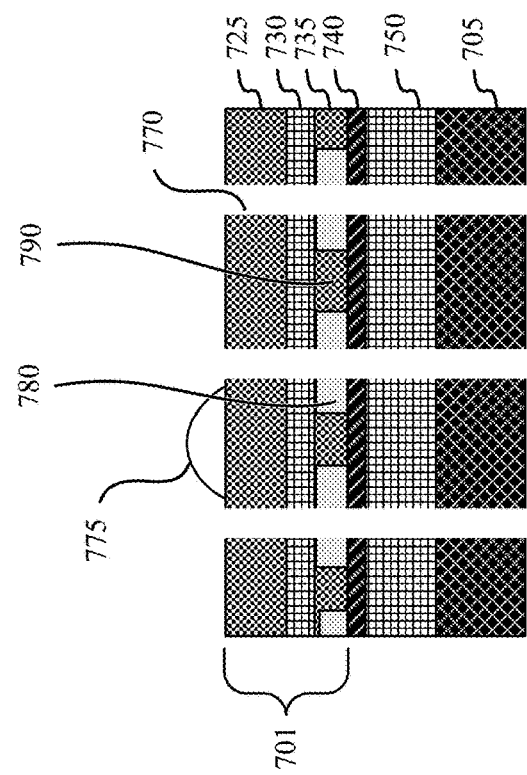

As shown in FIG. 7G, a lens 775 may be formed at a light exit surface of each LED. Lens 775 may increase the light extraction efficiency and decrease the emission cone of the LED. Alternatively, other light extraction features may be formed at the light exit surface of each LED, such as roughening of the light exit surface. Some examples of other light extraction features include graded index optics, Fresnel lenses, diffraction gratings, and anti-reflection (AR) coatings. Alternatively other features may be formed to increase the spontaneous emission rate, such as photonic crystals or an optical antenna.

Figure 8B:
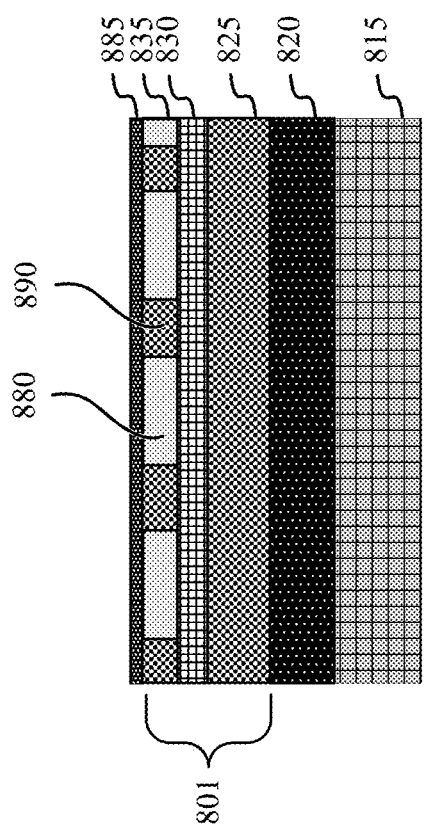
FIGS. 8A-8C illustrate various methods of bonding a base wafer to a semiconductor wafer.
Figure 8A:
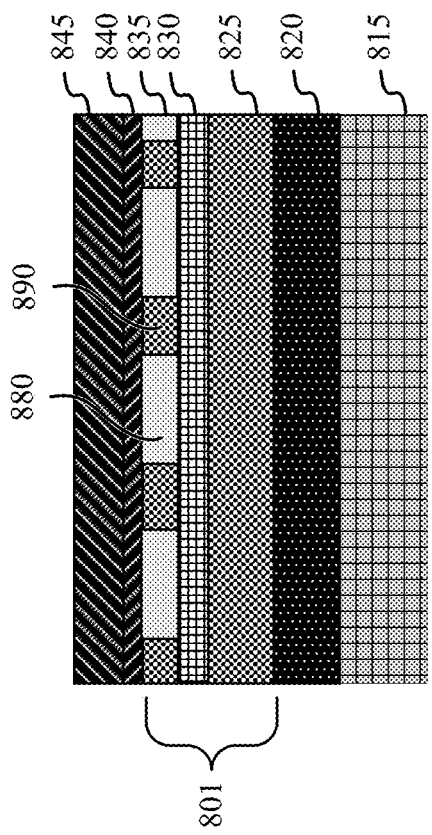
Figure 8C:
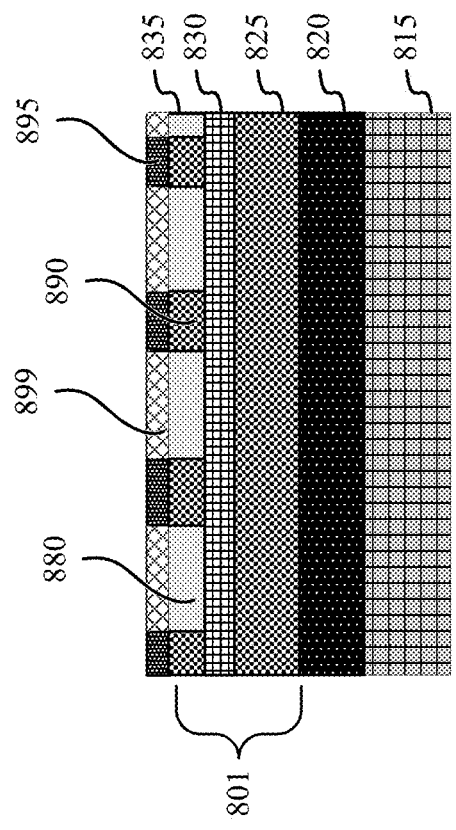

FIGS. 8A-8C illustrate various methods of bonding a base wafer to a semiconductor wafer. As shown in FIG. 8A, a structure for metal-to-metal bonding may include a substrate 815 and a semiconductor material 801. Semiconductor material 801 may include a plurality of epitaxial layers that are grown by any suitable epitaxial method on substrate 815. For example, semiconductor material 801 may include an n-type layer 825, a quantum well layer 830, and a p-type layer 835. Substrate 815 may be made of any material that is suitable for growing semiconductor material 801. For example, substrate 815 may be made of sapphire, and semiconductor material 801 may be made of GaN. Other layers may also be included, such as a buffer layer 820 between substrate 815 and n-type layer 825. Buffer layer 820 may be made of any suitable material, such as polycrystalline GaN or AlN, and may have a thickness of less than 50 nm.

A plurality of high resistivity areas alternating with a plurality of low resistivity areas may be formed by patterning of p-type layer 835 of semiconductor material 801. The high resistivity areas may have a higher resistivity than the low resistivity areas. Once p-type layer 835 have been patterned, p-type layer 835 includes a plurality of light emitters 890 (corresponding to the low resistivity areas) that alternate with a plurality of high resistivity areas 880. The patterning may be performed by any suitable method, such as plasma treatment or ion implantation. For example, lithography may be used to treat selected areas of p-type layer 835 with plasma in order to increase the resistivity in those areas. The depth of the treatment may extend through the entire p-type layer 835, and may not extend into quantum well layer 830. The p-type layer 835 may be polished back to be flat in order to provide a flat bonding surface. Alternatively, a thin slice of p-type layer 835 may be removed to form the flat bonding surface. In other embodiments, grinding and/or chemical etching may be used to form the flat bonding surface. Alternatively or in addition, any other suitable method may be used to planarize p-type layer 835.

A contact layer 840 may be deposited on p-type layer 835 of semiconductor material 801. Contact layer 840 may be made of any suitable material for providing an electrical contact to semiconductor material 801, such as a metal. Further, contact layer 840 may be optimized to have a high reflectivity. A bonding layer 845 may be deposited on contact layer 840. Bonding layer 845 may be made of any suitable material for providing a bond to semiconductor material 801, such as a metal. Contact layer 840 and bonding layer 845 may be made of different materials or the same material. Contact layer 840 and bonding layer 845 may be included in a single layer that is deposited on p-type layer 835, or they may be separate layers as shown in FIG. 8A. Bonding layer 845 may be used for metal-to-metal bonding, and bonding layer 845 may be made of Ti or any other suitable metal. Bonding layer 845 may be substantially flat, such that it sticks together with another metal bonding layer when they are pushed together.

As shown in FIG. 8B, a structure for eutectic bonding may include a substrate 815 and a semiconductor material 801 that includes an n-type layer 825, a quantum well layer 830, and a p-type layer 835. Substrate 815 may be made of any material that is suitable for growing semiconductor material 801. For example, substrate 815 may be made of sapphire, and semiconductor material 801 may be made of GaN. Other layers may also be included, such as a buffer layer 820 between substrate 815 and n-type layer 825. Buffer layer 820 may be made of any suitable material, such as polycrystalline GaN or AlN, and may have a thickness of less than 50 nm. A plurality of high resistivity areas alternating with a plurality of low resistivity areas may be formed by patterning of p-type layer 835 of semiconductor material 801. The high resistivity areas may have a higher resistivity than the low resistivity areas. Once p-type layer 835 has been patterned, p-type layer 835 includes a plurality of light emitters 890 (corresponding to the low resistivity areas) that alternate with a plurality of high resistivity areas 880. The patterning may be performed by any suitable method, such as plasma treatment or ion implantation. For example, lithography may be used to treat selected areas of p-type layer 835 with plasma in order to increase the resistivity in those areas. The depth of the treatment may extend through the entire p-type layer 835, and may not extend into quantum well layer 830. The p-type layer 835 may be polished back to be flat in order to provide a flat bonding surface. Alternatively, a thin slice of p-type layer 835 may be removed to form the flat bonding surface. In other embodiments, grinding and/or chemical etching may be used to form the flat bonding surface. Alternatively or in addition, any other suitable method may be used to planarize p-type layer 835. A eutectic bonding layer 885 may be deposited on p-type layer 835 of semiconductor material 801. Eutectic bonding layer 885 may be made of any suitable material for providing a eutectic bond to semiconductor material 801, such as CuSn or AuTi. Eutectic bonding layer 885 need not be substantially flat, because it will stick together with another metal bonding layer when they are heated and pushed together.

As shown in FIG. 8C, a structure for metal oxide bonding may include a substrate 815 and a semiconductor material 801 that includes an n-type layer 825, a quantum well layer 830, and a p-type layer 835. Substrate 815 may be made of any material that is suitable for growing semiconductor material 801. For example, substrate 815 may be made of sapphire, and semiconductor material 801 may be made of GaN. Other layers may also be included, such as a buffer layer 820 between substrate 815 and n-type layer 825. Buffer layer 820 may be made of any suitable material, such as polycrystalline GaN or AlN, and may have a thickness of less than 50 nm. A plurality of high resistivity areas alternating with a plurality of low resistivity areas may be formed by patterning of p-type layer 835 of semiconductor material 801. The high resistivity areas may have a higher resistivity than the low resistivity areas. Once p-type layer 835 has been patterned, p-type layer 835 includes a plurality of light emitters 890 (corresponding to the low resistivity areas) that alternate with a plurality of high resistivity areas 880. The patterning may be performed by any suitable method, such as plasma treatment or ion implantation. For example, lithography may be used to treat selected areas of p-type layer 835 with plasma in order to increase the resistivity in those areas. The depth of the treatment may extend through the entire p-type layer 835, and may not extend into quantum well layer 830. The p-type layer 835 may be polished back in order to provide a flat bonding surface. Alternatively, a thin slice of p-type layer 835 may be removed to form the flat bonding surface. In other embodiments, grinding and/or chemical etching may be used to form the flat bonding surface. Alternatively or in addition, any other suitable method may be used to planarize p-type layer 835.

A metal layer 895 may be formed on each of the light emitters 890. The metal layer 895 may be the contact for the LED device. High resistivity areas 880 may act as the oxide layer for bonding to another substrate. Alternatively, an oxide layer 899 may be formed on each of the high resistivity areas 880. Metal layer 895 may also be used to bond with another bonding layer. The high resistivity areas 880 or the oxide layer 899 may be used to create an initial bond with another substrate that also has an alternating pattern of oxide and metal areas. The substrates are aligned and an oxide-oxide bond is formed. The oxide-oxide bond may be formed at room temperature. Metal layer 895 may then be used to create a second bond to provide electrical connection and to enhance the strength of the first bond. The metal-metal bond may be formed by heating the substrates to close a gap between the metal areas of the two substrates, thereby creating a conductive path. The bonded substrates may then be further heated to compress the metal areas without applying external pressure.

Alternatively or in addition, various other bonding methods may be used. For example, anodic bonding, thermocompression bonding, ultraviolet (UV) bonding, and/or fusion bonding may be used. Further, a two-step bonding process may be used, in which an initial bond having moderate strength is created, and the initial bond is then enhanced after a substrate is removed and before the LEDs are singulated.

Figure 9B:
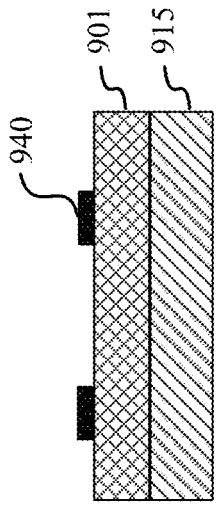
FIGS. 9A-9D illustrate a method of forming a surface for wafer-to-wafer bonding.
Figure 9D:
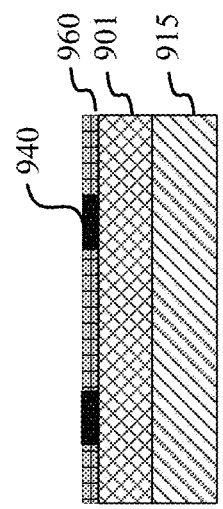
Figure 9A:
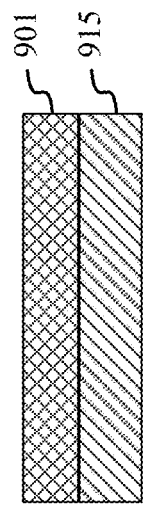

FIGS. 9A-9D illustrate a method of forming a surface for wafer-to-wafer bonding. As shown in FIG. 9A, a structure for wafer-to-wafer bonding may include a substrate 915 and a semiconductor material 901. Semiconductor material 901 may include a plurality of epitaxial layers that are grown by any suitable epitaxial method on substrate 915. Substrate 915 may be made of any material that is suitable for growing semiconductor material 901. For example, substrate 915 may be made of sapphire, and semiconductor material 901 may be made of GaN. Other layers may also be included, such as those described above.

As shown in FIG. 9B, contacts 940 may be deposited on semiconductor material 901. Contacts 940 may be made of any suitable material for providing an electrical contact to semiconductor material 901, such as a metal. Further, contacts 940 may be optimized to have a high reflectivity.

Figure 9C:
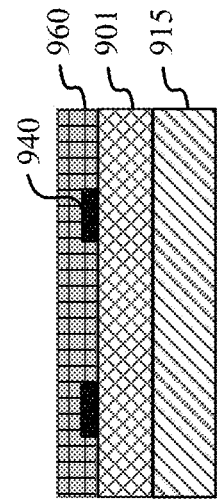

As shown in FIG. 9C, a passivation layer 960 may be deposited on semiconductor material 901 and contacts 940. Passivation layer 960 may be made of any suitable material, such as an oxide.

As shown in FIG. 9D, a portion of passivation layer 960 may be removed in order to provide a surface having contacts 940 and passivation layer 960 for bonding. Passivation layer 960 may be used to provide a flat bonding surface. For example, passivation layer 960 may be polished back to be flat and to expose contacts 940. Alternatively, a thin layer of passivation layer 960 and contacts 940 may be removed to form the flat bonding surface. In other embodiments, grinding and/or chemical etching may be used to form the flat bonding surface. Alternatively or in addition, any other suitable method may be used to planarize passivation layer 960 and contacts 940. The flat bonding surface may be used to bond substrate 915 to another wafer by metal oxide bonding as described above.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method comprising:
etching a semiconductor material to form a plurality of adjacent mesa shapes, the semiconductor material comprising one or more epitaxial layers;
forming a passivation layer to fill gaps between the adjacent mesa shapes such that no space remains between the adjacent mesa shapes;
planarizing the passivation layer and the semiconductor material, wherein the planarizing produces a flat surface comprising a surface of the passivation layer and a first surface of the semiconductor material;
forming a contact layer on the flat surface; and
bonding a base wafer to the contact layer.

2. The method of claim 1, further comprising removing a substrate from a second surface of the semiconductor material, wherein the second surface of the semiconductor material is opposite to the first surface of the semiconductor material; and
patterning a trench between each pair of the adjacent mesa shapes to form a plurality of light-emitting diodes.

3. The method of claim 2, further comprising forming a lens on a portion of the second surface of the semiconductor material corresponding to one of the plurality of light-emitting diodes.

4. The method of claim 2, further comprising forming a structure on the second surface of the semiconductor material to enhance a spontaneous emission rate, wherein the structure corresponds to one of the plurality of light-emitting diodes.

5. The method of claim 1, further comprising, before bonding the base wafer to the contact layer:
depositing a bonding layer on the contact layer,
wherein the base wafer is bonded to the contact layer via the bonding layer.

6. The method of claim 5, wherein the base wafer is bonded to the bonding layer by metal-to-metal bonding.

7. The method of claim 5, wherein the base wafer is bonded to the bonding layer by eutectic bonding.

8. The method of claim 5, wherein the base wafer is bonded to the bonding layer by oxide bonding.

9. The method of claim 5, wherein the base wafer is bonded to the bonding layer by at least one of anodic bonding, thermocompression bonding, ultraviolet bonding, or fusion bonding.

10. The method of claim 1, further comprising, before forming the passivation layer within gaps between the adjacent mesa shapes, depositing a reflective layer on a side wall of each of the adjacent mesa shapes.

11. The method of claim 1, wherein the semiconductor material comprises, in order, an n-type layer, a quantum well layer, and a p-type layer.

12. The method of claim 5, wherein the bonding layer and the contact layer are made of different metals.

13. The method of claim 5, wherein the bonding layer and the contact layer are made of the same metal.

14. The method of claim 1, wherein each of the adjacent mesa shapes has non-parallel side walls.

15. The method of claim 1, wherein each of the adjacent mesa shapes has a parabolic shape.

16. The method of claim 1, wherein the base wafer comprises a plurality of driver circuits, and the method further comprises aligning the plurality of driver circuits with the adjacent mesa shapes while bonding the base wafer to the contact layer.

17. The method of claim 2, further comprising roughening a portion of the second surface of the semiconductor material corresponding to one of the plurality of light-emitting diodes.

18. The method of claim 2, wherein the substrate is removed by focusing a laser beam at an interface between the substrate and the semiconductor material.

19. The method of claim 2, wherein the trenches are patterned by lithography.

20. The method of claim 2, wherein the removing of the substrate from the second surface of the semiconductor material is performed after bonding the base wafer to the contact layer.

21. The method of claim 20, wherein the patterning of the trench is performed after removing the substrate from the second surface of the semiconductor material.

22. The method of claim 2, wherein the trench extends through the semiconductor material and the contact layer.

23. The method of claim 22, wherein the trench extends into the base wafer.

* * * * *